United States Patent
Gao et al.

(10) Patent No.: US 12,057,051 B2
(45) Date of Patent: Aug. 6, 2024

(54) ARRAY SUBSTRATE, DISPLAY PANEL AND DISPLAYING DEVICE

(71) Applicants: Beijing BOE Optoelectronics Technology Co., Ltd., Beijing (CN); BOE Technology Group Co., Ltd., Beijing (CN)

(72) Inventors: Xiaojuan Gao, Beijing (CN); Shuqian Dou, Beijing (CN); Siqi Yin, Beijing (CN); Litao Fan, Beijing (CN); Xiaoping Zhang, Beijing (CN); Yangli Zheng, Beijing (CN); Jian Ren, Beijing (CN); Site Cai, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 425 days.

(21) Appl. No.: 17/486,729

(22) Filed: Sep. 27, 2021

(65) Prior Publication Data

US 2022/0246647 A1 Aug. 4, 2022

(30) Foreign Application Priority Data

Jan. 29, 2021 (CN) .......................... 202110125887.7

(51) Int. Cl.
*G09G 3/20* (2006.01)
*H01L 27/12* (2006.01)
(52) U.S. Cl.
CPC ......... *G09G 3/2092* (2013.01); *H01L 27/124* (2013.01); *H01L 27/1251* (2013.01);
(Continued)

(58) Field of Classification Search
None
See application file for complete search history.

(56) References Cited

U.S. PATENT DOCUMENTS

| 2009/0237423 A1 | 9/2009 | Shih et al. |
| 2010/0052713 A1* | 3/2010 | Kunimori .............. G09G 3/006 324/754.01 |
| 2011/0148834 A1* | 6/2011 | Baek .................... G09G 3/3406 345/207 |

FOREIGN PATENT DOCUMENTS

| CN | 103033262 A | | 4/2013 |
| CN | 111083256 A | * | 4/2020 |
| CN | 111083256 A | | 4/2020 |

* cited by examiner

*Primary Examiner* — Peter M Albrecht
(74) *Attorney, Agent, or Firm* — IPro, PLLC

(57) ABSTRACT

The disclosure provides an array substrate, a display panel and a displaying device, relating to the technical field of display ambient light. The array substrate has an active area and a peripheral area located on at least one side of the active area. The array substrate comprises a brightness detection module and a reference module. The brightness detection module is arranged in the peripheral area, comprising at least one first thin-film transistor. The brightness detection module is configured to receive ambient light, generate an ambient light brightness detecting current signal in response to the ambient light and output the ambient light brightness detecting current signal. The reference module is arranged in the peripheral area, comprising at least one second thin-film transistor. The reference module is configured to, in a dark state without ambient light, generate and output a reference current signal.

19 Claims, 8 Drawing Sheets

(52) U.S. Cl.
CPC ............... *G09G 2320/0626* (2013.01); *G09G 2360/144* (2013.01)

ARRAY SUBSTRATE, DISPLAY PANEL AND DISPLAYING DEVICE

CROSS REFERENCE TO RELEVANT DISCLOSURES

The application claims priority to Chinese Patent Application No. 202110125887.7, titled "ARRAY SUBSTRATE, DISPLAY PANEL AND DISPLAYING DEVICE" and filed to the State Patent Intellectual Property Office on Jan. 29, 2021, the contents of which are incorporated herein by reference in its entirety.

TECHNICAL FIELD

The disclosure relates to the technical field of display, in particular to an array substrate, a display panel and a displaying device.

BACKGROUND

Along with the development in the field of display technologies, a displaying device is added with an overall ambient light function, which is used to adjust display brightness of the displaying device at different ambient brightness, so it is ensured that the brightness of a display screen meets user's normal use demand, and power consumption of the displaying device may also be reduced.

SUMMARY

The objective of some embodiments of the disclosure is to provide an array substrate, a display panel and a displaying device so as to save the manufacturing costs of the displaying device on the basis of realizing detection of ambient light brightness.

The embodiments of the disclosure provide the following technical solution:

according to a first aspect, an array substrate is provided. The array substrate has an active area and a peripheral area located on at least one side of the active area. The array substrate comprises a brightness detection module and a reference module. The brightness detection module is arranged in the peripheral area, comprising at least one first thin-film transistor. The brightness detection module is configured to receive ambient light, generate an ambient light brightness detecting current signal in response to the ambient light and output the ambient light brightness detecting current signal. The reference module is arranged in the peripheral area, comprising at least one second thin-film transistor. The reference module is configured to, in a dark state without ambient light, generate and output a reference current signal.

Optionally, the brightness detection module comprises a plurality of first thin-film transistors in a parallel connection; and the reference module comprises a plurality of second thin-film transistors in a parallel connection.

Optionally, the ambient light comprises at least three primary colors; the array substrate further comprising: a color temperature detection module arranged in the peripheral area, comprising at least one thin-film transistor; the color temperature detection module being configured to receive the ambient light, and generate at least one color temperature detecting current signal in response to light of at least one primary color in the ambient light.

Optionally, the ambient light comprises light of a first primary color, light of a second primary color and light of a third primary color; the color temperature detection module comprises: a first color temperature detection assembly, comprising at least one third thin-film transistor; the first color temperature detection assembly being configured to receive the light of the first primary color in the ambient light, and generate a first color temperature detecting current signal in response to the light of the first primary color; a second color temperature detection assembly, comprising at least one fourth thin-film transistor; the second color temperature detection assembly being configured to receive the light of the second primary color in the ambient light, and generate a second color temperature detecting current signal in response to the light of the second primary color; and, a third color temperature detection assembly, comprising at least one fifth thin-film transistor; the third color temperature detection assembly being configured to receive the light of the third primary color in the ambient light, and generate a third color temperature detecting current signal in response to the light of the third primary color.

Optionally, the first color temperature detection assembly comprises a plurality of third thin-film transistors in a parallel connection, the second color temperature detection assembly comprises a plurality of fourth thin-film transistors in a parallel connection, and the third color temperature detection assembly comprises a plurality of fifth thin-film transistors in a parallel connection.

Optionally, the array substrate further comprising: at least one input signal line, at least one control signal line and a plurality of output signal lines, wherein the plurality of output signal lines comprise at least a first output signal line, a second output signal line, a third output signal line, a fourth output signal line and a fifth output signal line; a control electrode of the first thin-film transistor is electrically connected to one said control signal line, a first electrode of the first thin-film transistor is electrically connected to one said input signal line, and a second electrode of the first thin-film transistor is electrically connected to the first output signal line; a control electrode of the second thin-film transistor is electrically connected to one said control signal line, a first electrode of the second thin-film transistor is electrically connected to one said input signal line, and a second electrode of the second thin-film transistor is electrically connected to the second output signal line; a control electrode of the third thin-film transistor is electrically connected to one said control signal line, a first electrode of the third thin-film transistor is electrically connected to one said input signal line, and a second electrode of the third thin-film transistor is electrically connected to the third output signal line; a control electrode of the fourth thin-film transistor is electrically connected to one said control signal line, a first electrode of the fourth thin-film transistor is electrically connected to one said input signal line, and a second electrode of the fourth thin-film transistor is electrically connected to the fourth output signal line; and, a control electrode of the fifth thin-film transistor is electrically connected to one said control signal line, a first electrode of the fifth thin-film transistor is electrically connected to one said input signal line, and a second electrode of the fifth thin-film transistor is electrically connected to the fifth output signal line.

Optionally, the array substrate comprising at least two input signal lines, wherein part of the input signal lines are electrically connected to the first electrodes of part of all the thin-film transistors of the brightness detection module, the reference module and the color temperature detection module, and the remaining input signal lines are electrically connected to the first electrodes of the remaining ones of all the thin-film transistors of the brightness detection module, the reference module and the color temperature detection module; and the at least two input signal lines being configured to transmit identical input signals; and/or, at least two control signal lines, wherein part of the input signal lines are electrically connected to the control electrodes of part of all thin-film transistors of the brightness detection module, the reference module and the color temperature detection module, and the remaining control signal lines are electrically connected to the control electrodes of the remaining ones of all the thin-film transistors of the brightness detection module, the reference module and the color temperature detection module; and the at least two control signal lines being configured to transmit identical control signals.

Optionally, the at least two control signal lines comprise a first control signal line and a second control signal line; the control electrode of each of the first thin-film transistors, the control electrode of each of the third thin-film transistors, the control electrode of each of the fourth thin-film transistors, and the control electrode of each of the fifth thin-film transistors are electrically connected to the first control signal line, respectively; and, the control electrode of each of the second thin-film transistors is electrically connected to the second control signal line.

Optionally, the first color temperature detection assembly, the second color temperature detection assembly and the third color temperature detection assembly are arranged in turn along a length extension direction of the peripheral area where the color temperature detection module is located; or, the at least one third thin-film transistor, the at least one fourth thin-film transistor and the at least one fifth thin-film transistor are circularly arranged in turn along the length extension direction of the peripheral area where the color temperature detection module is located.

Optionally, the number of the third thin-film transistors of the first color temperature detection assembly, the number of the fourth thin-film transistors of the second color temperature detection assembly, the number of the fifth thin-film transistors of the third color temperature detection assembly, and the number of the first thin-film transistors of the brightness detection module are equal to the number of the second thin-film transistors of the reference module.

Optionally, the array substrate further comprising a plurality of thin-film transistors arranged in the active area; wherein the at least one first thin-film transistor of the brightness detection module and the at least one second thin-film transistor of the reference module are arranged on a same layer as the plurality of thin-film transistors located in the active area; and, under the condition that the array substrate further comprises the color temperature detection module and the color temperature detection module comprises at least one third thin-film transistor, at least one fourth thin-film transistor and at least one fifth thin-film transistor, the at least one third thin-film transistor, at least one fourth thin-film transistor and at least one fifth thin-film transistor are located on a same layer as the plurality of thin-film transistors located in the active area.

Optionally, the peripheral areas where the brightness detection module and the reference module are located are on a same side of the active area; and, under the condition that the array substrate further comprises the color temperature detection module, the color temperature detection module and the brightness detection module are located on a same side of the active area.

According to a second aspect, a display panel is provided, comprising the array substrate according to any one of the above-mentioned embodiments, and an opposite substrate arranged opposite to the array substrate. The opposite substrate comprises a light transmitting portion and a light shielding portion arranged in parallel along a direction in parallel with a plane where the opposite substrate is located.

The light transmitting portion allows the ambient light to transmit, and an orthographic projection of the light transmitting portion on the array substrate is at least partly superimposed with the brightness detection module of the array substrate. The light shielding portion is made of a light shielding material and is able to block the ambient light, and an orthographic projection of the light shielding portion on the array substrate is at least partly superimposed with the reference module of the array substrate.

Optionally, the array substrate further comprises a color temperature detection module, wherein the color temperature detection module comprises a first color temperature detection assembly, a second color temperature detection assembly and a third color temperature detection assembly.

The opposite substrate further comprises a plurality of light filtering portions, which are arranged in parallel with the light transmitting portion and the light shielding portion along a direction in parallel with a plane where the opposite substrate is located, wherein the plurality of light filtering portions include at least one first primary color filtering portion, at least one second primary color filtering portion and at least one third primary color filtering portion.

An orthographic projection of the at least one first primary color filtering portion on the array substrate is at least partly superimposed with the first color temperature detection assembly; an orthographic projection of the at least one second primary color filtering portion on the array substrate is at least partly superimposed with the second color temperature detection assembly; and an orthographic projection of the at least one third primary color filtering portion on the array substrate is at least partly superimposed with the third color temperature detection assembly.

Optionally, the opposite substrate further comprises a color film layer and a black matrix, which are located in an active area of the display panel, wherein the color film layer comprises a plurality of first primary color ring resistors, a plurality of second primary color ring resistors and a plurality of third primary color ring resistors.

The at least one first primary color filtering portion is made of the same material and located on the same layer as the plurality of first primary color ring resistors; the at least one second primary color filtering portion is made of the same material and located on the same layer as the plurality of second primary color ring resistors; and the at least one third primary color filtering portion is made of the same material and located on the same layer as the plurality of third primary color ring resistors; and/or, the light shielding portion is made of the same material and arranged on the same layer as the black matrix.

According to a third aspect, a displaying device is provided, comprising the display panel according to any one of the above-mentioned embodiments, and a detection driver. The detection driver is electrically connected to a brightness detection module and a reference module of the array substrate of the display panel, and configured to transmit control signals and input signals to the brightness detection module and the reference module to control the brightness detection module and the reference module to work, receive an ambient light brightness detecting current signal from the brightness detection module and a reference current signal from the reference module, and process the ambient light brightness detecting current signal and the reference current signal.

Optionally, the array substrate comprises a color temperature detection module, and the detection driver is further electrically connected to the color temperature detection module. The detection driver is configured to transmit control signals and input signals to the color temperature detection module to control the color temperature detection module to work, receive at least one color temperature detection current signal from the color temperature detection module, and process the at least one color temperature detection current signal.

Optionally, the array substrate comprises at least one input signal line, at least one control signal line and a plurality of output signal lines. The plurality of output signal lines include at least a first output signal line, a second output signal line, a third output signal line, a fourth output signal line and a fifth output signal line.

The detection driver comprises a plurality of connecting pins and a detection circuit; the plurality of connecting pins include at least one input pin, at least one control pin and a plurality of output pins; and the plurality of output pins include at least a first output pin, a second output pin, a third output pin, a fourth output pin and a fifth output pin. The at least one input signal line is respectively electrically connected to the at least one input pin; the at least one control signal line is respectively electrically connected to the at least one control pin; the first output signal line is electrically connected to the first output pin; the second output signal line is electrically connected to the second output pin; the third output signal line is electrically connected to the third output pin; the fourth output signal line is electrically connected to the fourth output pin; and fifth output signal line is electrically connected to the fifth output pin.

The detection circuit is electrically connected to the at least one input pin, the at least one control pin and the plurality of output pins, and configured to calculate a difference between the ambient light brightness detecting current signal and the reference current signal, calculate a difference between the at least one color temperature detecting current signal and the reference current signal, and process the obtained differences.

Optionally, the detection circuit comprises a calculation circuit, a voltage conversion circuit and an analog-digital conversion circuit.

The calculation circuit is configured to calculate the difference between the ambient light brightness detecting current signal and the reference current signal to obtain a first difference current signal, and calculate the difference between the at least one color temperature detecting current signal and the reference current signal to obtain at least one second difference current signal.

The voltage conversion circuit is electrically connected to the calculation circuit, and configured to convert the first difference current signal and the at least one second difference current signal into voltage signals to obtain a first difference voltage signal and at least one second difference voltage signal.

The analog-digital conversion circuit is electrically connected to the voltage conversion circuit, and configured to convert the first difference voltage signal and the at least one second difference voltage signal from analog signals into digital signals.

Optionally, the displaying device further comprises a source driver, a flexible printed circuit and a drive circuit board.

The source driver is electrically connected to a plurality of data lines of the display panel, and configured to transmit data signals to the plurality of data lines. The detection driver and the source driver are arranged on the flexible printed circuit; the detection driver and the source driver are electrically connected to the display panel through the flexible printed circuit; and the detection driver and the source driver are integrated.

The drive circuit board is electrically connected to the detection driver and the source driver through the flexible printed circuit. The drive circuit board is configured to obtain the actual brightness of the ambient light according to the difference between the ambient light brightness detecting current signal and the reference current signal from the detection driver, and adjust the display brightness of the display panel according to the actual brightness of the ambient light such that the display brightness is adapted to the actual brightness of the ambient light. Moreover, the drive circuit board is configured to calculate, according to the difference between the at least one color temperature detecting current signal and the reference current signal from the detection driver and the actual brightness of the ambient light, the proportion of the brightness of light of at least one primary color in the ambient light in the actual brightness of the ambient light, obtain the color temperature of the ambient light according to the proportion corresponding to the light of at least one primary color, and control the display panel to send prompt information for promoting a user of eye care.

BRIEF DESCRIPTION OF THE DRAWINGS

To describe the technical solutions in the embodiments of the disclosure more clearly, the drawings required to be used in the embodiments of the disclosure will be simply introduced below. Obviously, the drawings depicted below merely illustrate some embodiments of the disclosure. Other drawings may further be obtained by a person of ordinary skill in the art according to these drawings without creative work. In addition, the drawings in the following description may be construed as schematic diagrams, and should not construed as limiting the actual dimensions of products, actual flows of methods, actual time sequence of signals, etc. in the embodiments of the disclosure.

DETAILED DESCRIPTION

Figure 1:
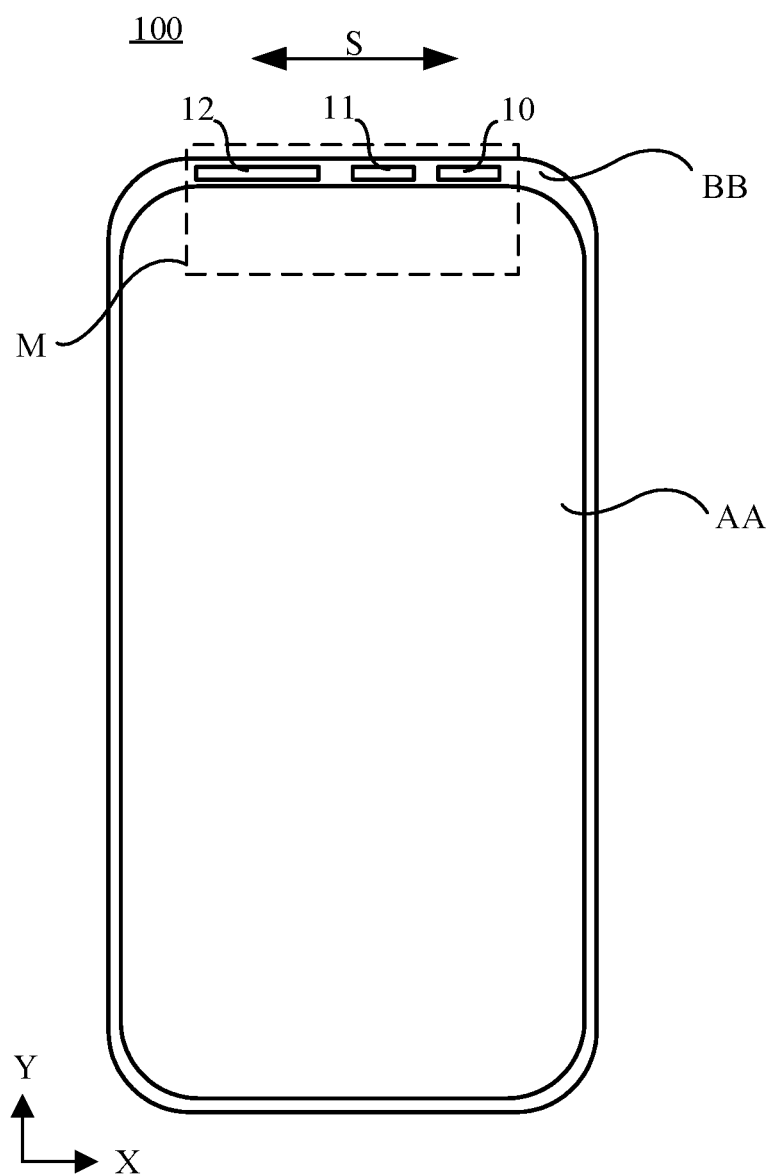
FIG. 1 is a structural diagram of an array substrate according to some embodiments of the disclosure.

The technical solutions in some embodiments of the disclosure will be described clearly and completely below in conjunction with the accompanying drawings. Obviously, the described embodiments are merely illustrative ones, and are not all possible ones of the disclosure. Based on the embodiments in the disclosure, all other embodiments obtained by an ordinarily skilled person in the art without creative labor shall fall within the protective scope of the disclosure.

Unless otherwise specified in the context, in the entire specification and claim, the term "comprise" should be construed as open and inclusive meanings, that is, "including, but not limited to". "One embodiment", "some embodiments", "exemplary embodiment", "example", "specific example", or "some examples" in this specification means that specific features, structures, materials, or characteristics described in conjunction with said embodiment or example are included in at least one embodiment or example of the disclosure. The illustrative expression of these terms in this specification does not definitely refer to the same embodiment or example. In addition, the specific features, structures, materials or characteristics may be combined in any one or more embodiments or examples in any appropriate manners.

In addition, terms "first" and "second" are merely for the purpose of description, and should not be construed as indicating or implying relative importance or implicitly indicating the number of technical features referred to. Thus, a feature defined by "first" or "second" may explicitly or implicitly refer to the inclusion of one or more said feature. Unless otherwise specified, "a plurality of" in the description of the disclosure refers to two or more.

A term "electrically connected" is used in description of some embodiments. For example, the term "electrically connected" is used in the description of some embodiments to indicate mutual electrical contact between two or more components.

"A and/or B" includes the following forms: single A, single B, and the combination of A and B.

Terms "applicable to" or "configured to" used in the specification are open and inclusive terms, which do not exclude devices applicable to execution of or configured to execute extra tasks or steps.

As used herein, the term "approximate" comprises a described value and a mean value within an acceptable deviation range of a specific value, and the acceptable deviation range is determined by, for example, those ordinarily skilled in the art after consideration of deviations (namely the limitations of a measuring system) related to measurement under discussion and specific amount of measurement.

This specification describes exemplary implementation methods with reference to sectional diagrams and/or planar diagrams of ideal exemplary drawings. In the drawings, thicknesses of layers and areas are amplified for the purpose of clarity. Therefore, changes relative to shapes in the drawings caused by, for example, manufacturing technologies and/or tolerance, are conceivable. Therefore, the exemplary embodiments should not be construed as limiting the shapes of area shown in the specification, but include shape deviations caused by, for example, manufacturing. For example, a rectangular etching area usually has a bendable characteristic. Therefore, areas shown in the drawings are essentially schematic, and are not intended to indicate the actual shapes of the areas of devices and to limit the scope of the exemplary embodiments.

As shown in FIG. 1, some embodiments of the disclosure provide an array substrate 100, wherein the array substrate 100 has an active area AA (AA for short), and a peripheral area BB located on at least one side of the active area AA.

Exemplarily, as shown in FIG. 1, the peripheral area BB may be arranged around the four sides of the active area AA.

Figure 2:
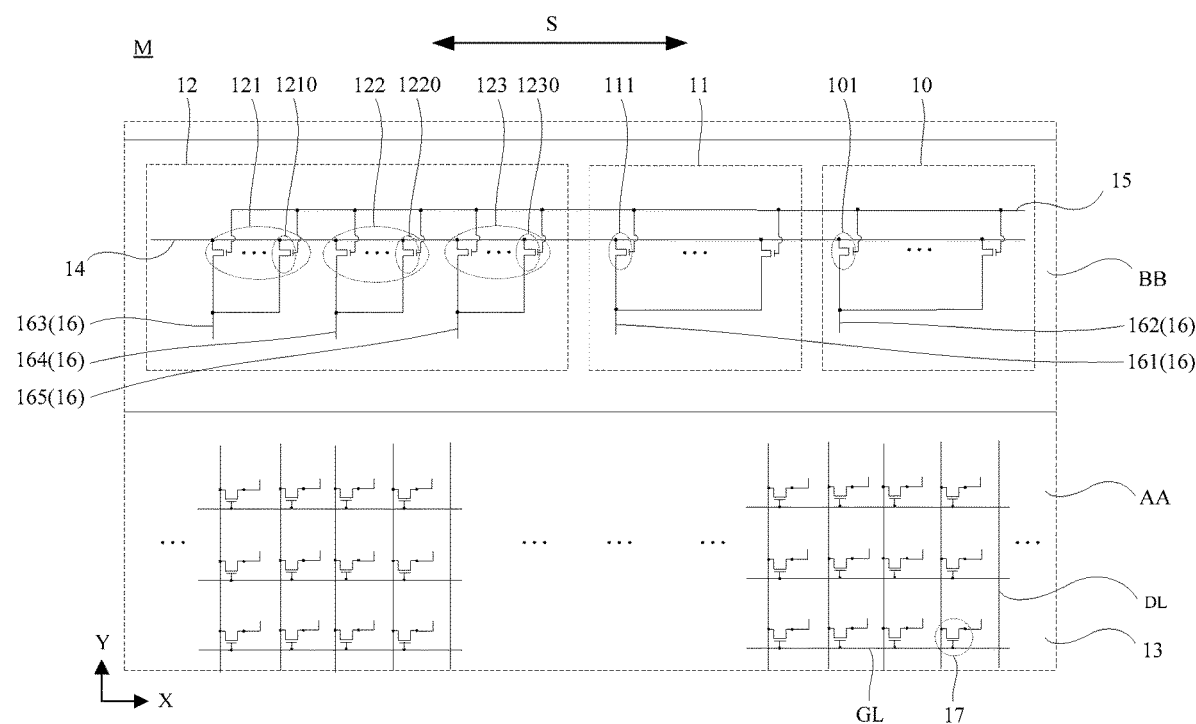
FIG. 2 is a partial enlarged view of position M in FIG. 1.

As shown in FIG. 1 and FIG. 2, the array substrate 100 comprises a brightness detection module 11 and a reference module 10.

As shown in FIG. 1 and FIG. 2, the brightness detection module 11 is arranged in the peripheral area BB; the brightness detection module 11 comprises at least one first thin-film transistor 111; and the brightness detection module 11 is configured to receive ambient light, generate an ambient light brightness detecting current signal in response to the ambient light and output the ambient light brightness detecting current signal.

It should be noted that, the brightness detection module 11 comprises at least one first thin-film transistor 111, and materials of an active layer of the at least one first thin-film transistor 111 include a light-sensitive material, such that the first thin-film transistor 111 is able to generate a light-generated current when receiving irradiation of the ambient light, and the ambient light brightness detecting current signal includes the light-generated current.

Moreover, the value of the light-generated current generated by the first thin-film transistor 111 varies with the intensity of the ambient light received by the active layer, so the size of ambient light brightness detecting current signal differs. That is, the larger the light-generated current generated by the first thin-film transistor 111, the larger the ambient light brightness detecting current signal.

Exemplarily, the materials of the active layer of the first thin-film transistor 111 include amorphous silicon.

As shown in FIG. 1 and FIG. 2, the reference module 10 is arranged in the peripheral area BB; the reference module 10 comprises at least one second thin-film transistor 101; the reference module 10 is configured to, in a dark state without ambient light, generate and output a reference current signal.

It should be noted that, when the reference module 10 is in the dark state without ambient light, a leak current that flows through the at least one second thin-film transistor 101 of the reference module 10 is the reference current signal.

According to the embodiments of the disclosure, in the peripheral area BB of the array substrate 100, at least one first thin-film transistor 111 is used to manufacture the brightness detection module 11, and at least one second thin-film transistor 101 is used to manufacture the reference module 10. The brightness detection module 11 receives irradiation of the ambient light, generates and outputs the ambient light brightness detecting current signal, such that the reference module 10, in the dark state without ambient light, generates and outputs the reference current signal. In this way, the actual brightness of the ambient light may be obtained according to the ambient light brightness detecting current signal and the reference current signal. Since the thin-film transistors are used to form the brightness detection module 11 and the reference module 10, the brightness detection module 11 and the reference module 10 may be formed in the same process as the thin-film transistors for forming a pixel unit in the array substrate 100, and it does not need to purchase an independent ambient light sensor, thereby saving the manufacturing costs of the displaying device.

Moreover, as the thin-film transistor generates a leak current during working, the ambient light brightness detecting current signal output by the brightness detection module 11 includes, in addition to the light-generated current generated, due to light irradiation, by each of the first thin-film transistors 111 in the brightness detection module 11, a leak current generated by each of the first thin-film transistors 111. The reference module 10 is set as a reference. The reference current signal outputted by the reference module 10 actually may represent the leak current generated by each of the first thin-film transistors 111. The brightness detection module 11 is compared with the reference module 10. The leak current (reference current signal) of the brightness detection module 11 in the dark state without ambient light is removed from the ambient light brightness detecting current signal to obtain the light-generated current generated by the brightness detection module 11 merely because of irradiation of ambient light. The actual brightness of the ambient light may be obtained according to the light-generated current, which is conducive to enhancement of the detection accuracy of the brightness detection module 11.

According some embodiments, as shown in FIG. 2, the brightness detection module 11 comprises a plurality of first thin-film transistors 111 in a parallel connection, so the ambient light brightness detecting current signal generated by the brightness detection module 11 is equal to the sum of a current flowing through each of the first thin-film transistors 111.

Exemplarily, the number of the first thin-film transistors 111 of the brightness detection module 11 is 290-310, for example, 290, 296, 300, 305 or 310.

Through arrangement of the plurality of first thin-film transistors 111 in a parallel connection, the sum of the current flowing through each of the first thin-film transistors 111 is used as the ambient light brightness detecting current signal. Comparing with the current flowing through each of the first thin-film transistors 111, the ambient light brightness detecting current signal is larger, which is conducive to the enhancement of the detection precision of the ambient light brightness.

Moreover, since the brightness detection module 11 comprises a plurality of first thin-film transistors 111 in a parallel connection, under the condition that a few first thin-film transistors 111 have a relatively poor light sensitive characteristic, the current flowing through the few first thin-film transistors 111 is very small relative to the ambient light brightness detecting current signal and may even be neglected, thereby ensuring the detection precision of the ambient light brightness.

As shown in FIG. 2, the reference module 10 comprises a plurality of second thin-film transistors 101 in a parallel connection, so the current flowing through the reference module 10 is equal to the sum of a current flowing through each of the second thin-film transistors 101.

Exemplarily, the number of the second thin-film transistors 101 of the reference module 10 is 290-310, for example, 290, 296, 300, 305 or 310.

Through arrangement of the plurality of second thin-film transistors 101 in a parallel connection, the sum of the current flowing through each of the second thin-film transistors 101 is used as the reference current signal. Compared with the current flowing through each of the second thin-film transistors 101, the reference current signal is larger, which is conducive to enhancement of the detection precision of the ambient light brightness.

Moreover, since the reference module 10 comprises a plurality of second thin-film transistors 101 in a parallel connection, under the condition that a few second thin-film transistors 101 have a relatively poor light sensitive characteristic, the current flowing through the few second thin-film transistors 101 is very small relative to the reference current signal and may even be neglected, thereby ensuring the detection precision of the ambient light brightness.

According to some embodiments, the number of the first thin-film transistors 111 of the brightness detection module 11 is equal to the number of the second thin-film transistors 101 of the reference module 10, so the leak current of the brightness detection module 11 in the dark state without ambient light is equal to the reference current signal generated by the reference module 10. Thus, the leak current is removed from the ambient light brightness detecting current signal to obtain the light-generated current that is generated by the brightness detection module 11 merely because of irradiation of ambient light. The actual brightness of the ambient light may be obtained according to the light-generated current.

According to some embodiments, as shown in FIG. 1, the peripheral area BB where the brightness detection module 11 and the reference module 10 are located may be located on the same side of the active area AA.

Exemplarily, the peripheral area BB where the brightness detection module 11 and the reference module 10 are located and a side of the array substrate 100 that is configured to bind a flexible printed circuit are respectively located on two opposite sides of the active area AA. The side of the array substrate 100 that is configured to bind the flexible printed circuit is usually a side on which a user operates the displaying device, such that the brightness detection module 11 and the reference module 10 are away from the side of the array substrate 100 that the flexible printed circuit is bound, thus avoiding the situation that a user blocks the ambient light from irradiating the brightness detection module 11 in the operation process.

It is understandable that, locating the brightness detection module 11 and the reference module 10 on the same side of the active area AA ensures that the brightness detection module 11 and the reference module 10 are in basically similar working environment on the array substrate 100. Doing so may eliminate the influence of difference in the working environment on the detection by the brightness detection module 11 and the reference module 10, which is conducive to the enhancement of the detection precision of the brightness detection module 11 and the reference module 10.

The ambient light includes some blue light. If a user receives such ambient light for a long time, the blue light will do harm to eyes and skins of people, and disturb the sleep of people to result in circadian rhythm disorders and lower immunity of the human body. The proportions of light rays of various colors in the ambient light are capable of being detected to obtain the color temperature of the ambient light, and whether to prompt a user of eye care is determined according to the color temperature.

On this basis, according to some embodiments, the ambient light comprises light of at least three primary colors. For example, the ambient light comprises red light, green light and blue light.

As shown in FIG. 2, the array substrate 100 further comprises a color temperature detection module 12, which is arranged on a base plate 13 and located in the peripheral area BB. The color temperature detection module 12 comprises at least one thin-film transistor. The color temperature detection module 12 is configured to receive the ambient light, and generate at least one color temperature detecting current signal in response to the light of at least one primary color in the ambient light.

It should be noted that, the working principle of the color temperature detection module 12 is similar to that of the brightness detection module 11, and materials of the active layer of the at least one thin-film transistor of the color temperature detection module 12 also include the light-sensitive material, so the thin-film transistor generates the light-generated current when irradiated by light of at least one primary color in the ambient light, and the color temperature detecting current signal comprises the light-generated current.

Moreover, the value of the light-generated current generated varies with the intensity of the light of at least one primary color received by the thin-film transistor, so the size of the color temperature detecting current signal differs. That is, the larger the light-generated current generated by the thin-film transistor, the larger the color temperature detecting current signal.

According to the above-mentioned embodiments of the disclosure, in the peripheral area BB of the array substrate 100, at least one thin-film is used to manufacture the color temperature detection module 12, and the color temperature detection module 12 receives irradiation of the light of at least one primary color in the ambient light to generate at least one color temperature detecting current signal. In this way, the actual brightness of the light of at least one primary color may be obtained according to the at least one color temperature detecting current signal and the reference current signal. By comparing the actual brightness of the light of at least one primary color with the actual brightness of the ambient light, the proportion of the light of at least one primary color in the ambient light is capable of being obtained.

According to some embodiments, as shown in FIG. 1, the color temperature detection module 12 and the brightness detection module 11 may be located on the same side of the active area AA.

It is understandable that, locating the color temperature detection module 12 and the brightness detection module 11 on the same side of the active area AA ensures that the color temperature detection module 12 and the brightness detection module 11 are in basically similar working environment on the array substrate 100 (the two receive basically similar ambient light). Doing so may eliminate the influence of difference in working environment on the detection by the color temperature detection module 12 and the brightness detection module 11, which is conducive to the enhancement of the detection precision of color temperature.

According to some embodiments, the ambient light comprises light of a first primary color, light of a second primary color and light of a third primary color. As shown in FIG. 2, the color temperature detection module 12 comprises a first color temperature detection assembly 121, a second color temperature detection assembly 122 and a third color temperature detection assembly 123.

The first color temperature detection assembly 121 comprises at least one third thin-film transistor 1210. The first color temperature detection assembly 121 is configured to receive the light of the first primary color in the ambient light, and generate a first color temperature detecting current signal in response to the light of the first primary color.

Exemplarily, materials of the active layer of the third thin-film transistor 1210 may include the light-sensitive material.

Exemplarily, the light of the first primary color is red light, and the first color temperature detection assembly 121 receives red light in the ambient light and generates a first color temperature detecting current signal in response to the red light.

The second color temperature detection assembly 122 comprises at least one fourth thin-film transistor 1220. The second color temperature detection assembly 122 is configured to receive the light of the second primary color in the ambient light, and generate a second color temperature detecting current signal in response to the light of the second primary color.

Exemplarily, materials of the active layer of the fourth thin-film transistor 1220 may include the light-sensitive material.

Exemplarily, the light of the second primary color is green light, and the second color temperature detection assembly 122 receives green light in the ambient light and generates a second color temperature detecting current signal in response to the green light.

The third color temperature detection assembly 123 comprises at least one fifth thin-film transistor 1230. The third color temperature detection assembly 123 is configured to receive the light of the third primary color in the ambient light, and generate a third color temperature detecting current signal in response to the light of the third primary color.

Exemplarily, materials of the active layer of the fifth thin-film transistor 1230 may include the light-sensitive material.

Exemplarily, the light of the third primary color is blue light, and the third color temperature detection assembly 123 receives blue light in the ambient light and generates a third color temperature detecting current signal in response to the blue light.

According to some embodiments, as shown in FIG. 2, the first color temperature detection assembly 121 comprises a plurality of third thin-film transistors 1210 in a parallel connection, so a current flowing through the first color temperature detection assembly 121 is equal to the sum of a current flowing through each of the third thin-film transistors 1210.

Exemplarily, the number of the third thin-film transistors 1210 of the first color temperature detection assembly 121 is 290-310, for example, 290, 296, 300, 305 or 310.

Through arrangement of the plurality of third thin-film transistors 1210 in a parallel connection, the sum of the current flowing through each of the third thin-film transistors 1210 is used as the first color temperature detecting current signal. Compared with the current flowing through each of the third thin-film transistors 1210, the first color temperature detecting current signal is larger, which is conducive to the enhancement of the detection precision of the first color temperature detection assembly 121.

Moreover, under the condition that a few third thin-film transistors 1210 have a relatively poor light sensitive characteristic, the current flowing through the few third thin-film transistors 1210 is very small relative to the reference current signal and may even be neglected, thereby ensuring the defection precision of the first color temperature detection assembly 121.

The second color temperature detection assembly 122 comprises a plurality of fourth thin-film transistors 1220 in a parallel connection, so a current flowing through the second color temperature detection assembly 122 is equal to the sum of a current flowing through each of the fourth thin-film transistors 1220.

Exemplarily, the number of the fourth thin-film transistors 1220 of the second color temperature detection assembly 122 is 290-310, for example, 290, 296, 300, 305 or 310.

Through arrangement of the plurality of fourth thin-film transistors 1220 in parallel connection, the sum of the current flowing through each of the fourth thin-film transistors 1220 is used as the second color temperature detecting current signal. Compared with the current flowing through each of the fourth thin-film transistors 1220, the second color temperature detecting current signal is larger, which is conducive to the enhancement of the detection precision of the second color temperature detection assembly 122.

Moreover, under the condition that a few fourth thin-film transistors 1220 have a relatively poor light sensitive characteristic, the current flowing through the few fourth thin-film transistors 1220 is very small relative to the second color temperature detecting current signal and may even be neglected, thereby ensuring the detection precision of the second color temperature detection assembly 122.

The third color temperature detection assembly 123 comprises a plurality of fifth thin-film transistors 1230 in a parallel connection, so a current flowing through the third color temperature detection assembly 123 is equal to the sum of a current flowing through each of the fifth thin-film transistors 1230.

Exemplarily, the number of the fifth thin-film transistors 1230 of the third color temperature detection assembly 123 is 290-310, for example, 290, 296, 300, 305 or 310.

Through arrangement of the plurality of fifth thin-film transistors 1230 in a parallel connection, the sum of the current flowing through each of the fifth thin-film transistors 1230 is used as the third color temperature detecting current signal. Compared with the current flowing through each of the fifth thin-film transistors 1230, the third color temperature detecting current signal is larger, which is conducive to enhancement of the detection precision of the third color temperature detection assembly 123.

Moreover, under the condition that a few fifth thin-film transistors 1230 have a relatively poor light sensitive characteristic, the current flowing through the few fifth thin-film transistors 1230 is very small relative to the third color temperature detecting current signal and may even be neglected, thereby ensuring the detection precision of the third color temperature detection assembly 123.

According to some embodiments, as shown in FIG. 1 and FIG. 2, the first color temperature detection assembly 121, the second color temperature detection assembly 122 and the third color temperature detection assembly 123 may be arranged in turn along a length extension direction S of the peripheral area BB where the color temperature detection module 12 is located, so the utilization rate of the peripheral area BB along the direction S may be increased, thereby reducing the size of the peripheral area BB along a direction Y, assisting in the enhancement of the proportion of the peripheral area AA in the entire surface of the display panel, and further increasing the screen-to-body ratio of the display panel.

Figure 3:
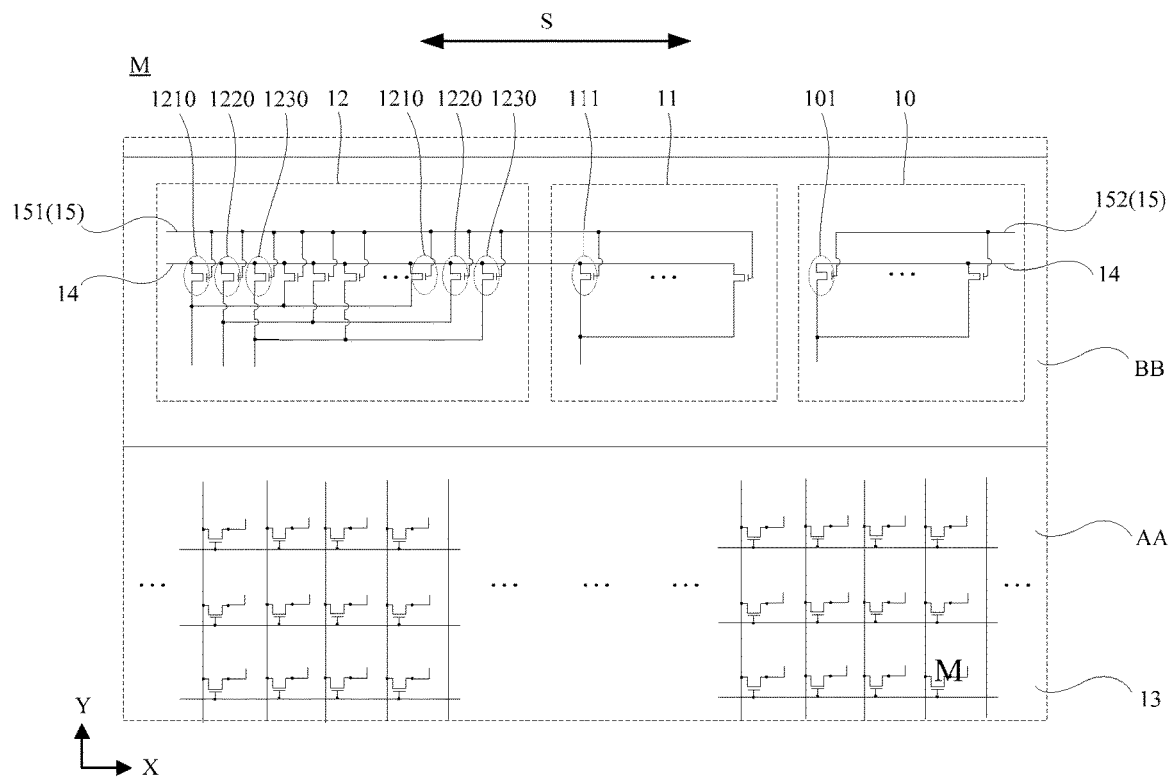
FIG. 3 is another structural diagram of the array substrate according to some embodiments of the disclosure.

According to some embodiments, as shown in FIG. 3, at least one third thin-film transistor 1210, at least one fourth thin-film transistor 1220 and at least one fifth thin-film transistor 1230 are circularly arranged in turn along the length extension direction S of the peripheral area BB where the color temperature detection module 12 is located. That is, from the left to the right in FIG. 3, the thin-film transistors are arranged in turn in the following pattern: the third thin-film transistor 1210, the fourth thin-film transistor 1220, the fifth thin-film transistor 1230, the third thin-film transistor 1210, the fourth thin-film transistor 1220, the fifth thin-film transistor 1230, . . . .

According to the previous description it can be known that, the first color temperature detection assembly 121 receives the light of the first primary color in the ambient light, the second color temperature detection assembly 122 receives the light of second primary color in the ambient light, and the third color temperature detection assembly 123 receives the light of the third primary color in the ambient light.

It is understandable that, a first primary color filtering portion for transmitting the light of the first primary color is arranged on a side of each of the third thin-film transistors 1210 close to the outside environment, a second primary color filtering portion for transmitting the light of the second primary color is arranged on a side of each of the fourth thin-film transistors 1220 close to the outside environment, and a third primary color filtering portion for transmitting the light of the third primary color is arranged on a side of each of the fifth thin-film transistors 1230 close to the outside environment. As the first primary color filtering portion, the second primary color filtering portion and the third primary color filtering portion are respectively in a color of the light of corresponding primary color, so the circular arrangement pattern in which one third thin-film transistor 1210, one fourth thin-film transistor 1220 and one fifth thin-film transistor 1230 are arranged in turn avoids gathering of the filtering portions of the same color. Doing so prevents human eyes from telling the color difference among the first primary color filtering portion, the second primary color filtering portion and the third primary color filtering portion, which may otherwise affect the appearance effect of the displaying device.

According to some embodiments, the number of the third thin-film transistors 1210 of the first color temperature detection assembly 121 and the number of the fourth thin-film transistors 1220 of the second color temperature detection assembly 122 are equal to the number of the fifth thin-film transistors 1230 of the third color temperature detection assembly 123. Doing so eliminates the difference in the color temperature detecting current signals caused by the different numbers of the thin-film transistors of different color temperature detection assemblies, thereby ensuring the detection precision of the color temperature.

According to some embodiments, the number of the third thin-film transistors 1210 of the first color temperature detection assembly 121, the number of the fourth thin-film transistors 1220 of the second color temperature detection assembly 122, the number of the fifth thin-film transistors 1230 of the third color temperature detection assembly 123, the number of the first thin-film transistors 111 of the brightness detection module 11 are equal to the number of the second thin-film transistors 101 of the reference module 10.

When the number of the thin-film transistors of each of the color temperature detection assemblies is set to be equal to the number of the second thin-film transistors 101 of the reference module 10, the leak current of each of the color temperature detection assemblies in the dark state without ambient light is equal to the reference current signal generated by the reference module 10. Thus, the leak current is removed from each of the color temperature detecting current signals to obtain the light-generated current that is generated by each of the color temperature detection assemblies merely because of irradiation of ambient light. The actual brightness of the ambient light of the light of each primary color is capable of being obtained according to the light-generated current.

Exemplarily, the number of the third thin-film transistors 1210 of the first color temperature detection assembly 121, the number of the fourth thin-film transistors 1220 of the second color temperature detection assembly 122, the number of the fifth thin-film transistors 1230 of the third color temperature detection assembly 123, the number of the first thin-film transistors 111 of the brightness detection module 11, and the number of the second thin-film transistors 101 of the reference module 10 are all 300.

According to some embodiments, as shown in FIG. 2, the array substrate 100 further comprises at least one input signal line 14, at least one control signal line 15 and a plurality of output signal lines 16 arranged on a base plate 13. The plurality of output signal lines 16 include at least a first output signal line 161, a second output signal line 162, a third output signal line 163, a fourth output signal line 164 and a fifth output signal line 165.

For each of the first thin-film transistors 111 of the brightness detection module 11, a control electrode of the first thin-film transistor 111 is electrically connected to one control signal line 15, a first electrode of the first thin-film transistor 111 is electrically connected to one input signal line 14, and a second electrode of the first thin-film transistor 111 is electrically connected to the first output signal line 161.

For each of the second thin-film transistors 101 of the reference module 10, a control electrode of the second thin-film transistor 101 is electrically connected to one control signal line 15, a first electrode of the second thin-film transistor 101 is electrically connected to one input signal line 14, and a second electrode of the second thin-film transistor 101 is electrically connected to the second output signal line 162.

For each of the third thin-film transistors 1210 of the first color temperature detection assembly 121, a control electrode of the third thin-film transistor 1210 is electrically connected to one control signal line 15, a first electrode of the third thin-film transistor 1210 is electrically connected to one input signal line 14, and a second electrode of the third thin-film transistor 1210 is electrically connected to the third output signal line 163.

For each of the fourth thin-film transistors 1220 of the second color temperature detection assembly 122, a control electrode of the fourth thin-film transistor 1220 is electrically connected to one control signal line 15, a first electrode of the fourth thin-film transistor 1220 is electrically connected to one input signal line 14, and a second electrode of the fourth thin-film transistor 1220 is electrically connected to the fourth output signal line 164.

For each of the fifth thin-film transistors 1230 of the third color temperature detection assembly 123, a control electrode of the fifth thin-film transistor 1230 is electrically connected to one control signal line 15, a first electrode of the fifth thin-film transistor 1230 is electrically connected to one input signal line 14, and a second electrode of the fifth thin-film transistor 1230 is electrically connected to the fifth output signal line 165.

It should be noted that at least one control signal line 15 is configured to transmit control signals to control the on or off of the thin-film transistors electrically connected to the at least one control signal line. For example, when the control signals are periodical square signals (refer to the time sequence of P2/P3 in FIG. 11), since the thin-film transistor has a plurality of conductive film layers inside and coupling voltage is generated between two adjacent conductive film layers, the control signals periodically drive the thin-film transistor to enable two adjacent conductive film layers in the thin-film transistor to generate positive coupling voltage and negative coupling voltage there-between, and the positive coupling voltage and negative coupling voltage are capable of being counteracted mutually, thereby solving the problem of threshold voltage shift of the thin-film transistor.

"P2/P3" refers to the that, when the number of the control signal lines 15 is 2, the control signal transmitted by one of the control signal lines 15 is "P2", and the control signals transmitted by the other one control signal line 15 is "P3".

Figure 12:
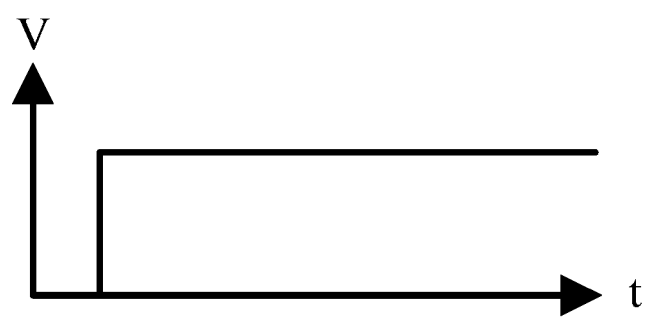
FIG. 12 is a theoretical curve graph of a relationship between control voltage or input voltage of a detection module according to some embodiments of the disclosure and time.
Figure 13:
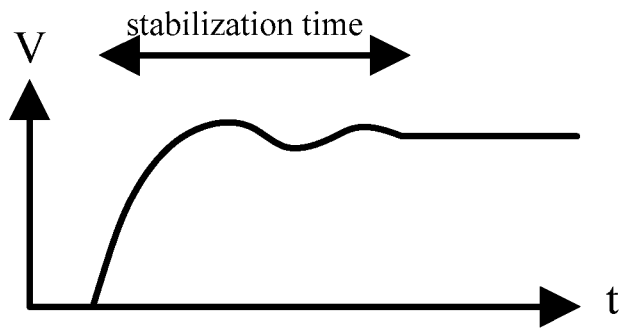
FIG. 13 is an actual curve graph of a relationship between the control voltage or input voltage of the detection module according to some embodiments of the disclosure and time.

As shown in FIG. 12, in an ideal state, the detection module receives control signals, and after a period of response time, the current signal outputted by the detection module gets stable at a moment. Actually, as shown in FIG. 13, the detection module receives control signals, and after a period of stabilization time, the current signals outputted by the detection module get stable. Therefore, shortening the stabilization time may improve the stability of the current signal outputted by the detection module, which is conducive to enhancing the accuracy of the acquired current signals.

It should be noted that, the "detection module" may refer to the reference module 10, the brightness detection module 11 and the color temperature detection module 12 mentioned hereinabove. The three modules may all be called "detection module".

Figure 11:
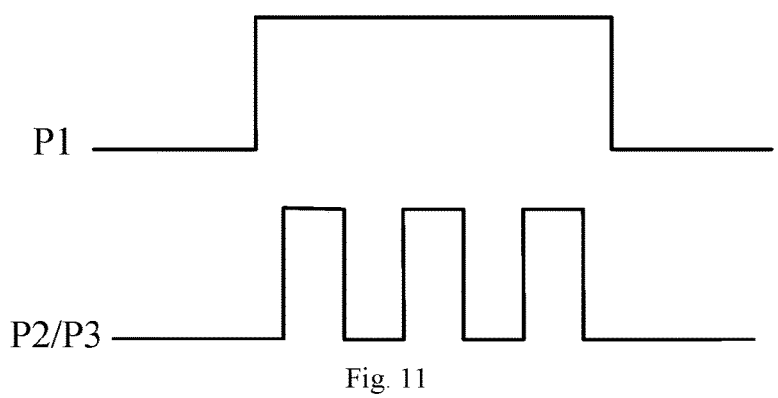
FIG. 11 is a sequence chart of input signals and control signals according to some embodiments of the disclosure.

As shown in FIG. 11, at least one input signal line 14 is configured to transmit input signals P1, such that the thin-film transistor electrically connected to the at least one input signal line is able to generate the light-generated current in the switched-on state.

As shown in FIG. 12, in the ideal state, the detection module receives input signals, and after a period of response time, the current signal outputted by the detection module gets stable at a moment. Actually, as shown in FIG. 13, the detection module receives input signals, and after a period of stabilization time, the current signal outputted by the detection module gets stable. Therefore, shortening the stabilization time may improve the stability of the current signal outputted by the detection module, which is conducive to enhancing the accuracy of the acquired current signals.

Exemplarily, the input signal P1 and the control signal (namely P2/P3) both have a high potential in the range from 7.69V-to 19V, for example, 7.69V, 12V, 14V 16V, 19V, etc.

Exemplarily, the input signal P1 and the control signal (namely P2/P3) both have a low potential in the range from −4.65V to −16V, for example, −4.65V, −8V, −12V, −14V, −16V, etc.

According to some embodiments, the signal line itself has impedance and therefore generates a voltage drop (IR-Drop) when transmitting voltage signals, and as the signal line extends, the signal line has larger impedance and generates a greater voltage drop, so the input signal received by the detection module and the detecting current signal outputted by the detection module decrease. To reduce the interference with the detecting current signal by the impedance of the signal line, as shown in FIG. 2, the two ends of the input signal line 14 both are used as input ends, transmitting input signals to both ends of the input signal line 14 at the same time may reduce the voltage drop generated when the input signal line 14 transmits the input signals, thereby reducing the interference with the detecting current signal by the impedance of the input signal line 14.

Similarly, according to some embodiments, the two ends of the output signal line 15 both are used as input ends, and transmitting control signals to both ends of the control signal line 15 at the same time may reduce the voltage drop generated when the control signal line 15 transmits the control signals, thereby reducing the interference with the detecting current signal by the impedance of the control signal line 15.

In addition, the purpose of reducing the interference with the detecting current signal by the impedance of the signal may further be fulfilled by the arrangement mode of the signal lines in the following embodiments.

According to some embodiments, as shown in FIG. 3, the array substrate 100 comprises at least two input signal lines 14, wherein part of the input signal lines 14 are electrically connected to the first electrodes of part of all thin-film transistors of the brightness detection module 11, the reference module 10 and the color temperature detection module 12, and the remaining input signal lines 14 are electrically connected to the first electrodes of the remaining ones of all the thin-film transistors of the brightness detection module 11, the reference module 10 and the color temperature detection module 12.

It should be noted that, at least two input signal lines 14 are configured to transmit the same input signals, such that each of the thin-film transistors receives the same input signals. In this way, each of the thin-film transistors may generate the light-generated current while maintaining the switched-on state.

Through the above-mentioned arrangement mode of the input signal lines 14, among at least two input signal lines 14, part of the input signal lines 14 are configured to transmit input signals to part of all the thin-film transistors, and the remaining input signal lines 14 are configured to transmit input signals to the remaining ones of all the thin-film transistors, so the voltage drop generated when the input signal line 14 transmits the input signals may be further reduced, thereby reducing the interference with the detecting current signal by the impedance of the input signal line 14.

Moreover, at least two input signal lines 14 respectively transmit input signals, and may provide the input signals to different thin-film transistors.

Exemplarily, as shown in FIG. 3, the array substrate 100 comprises at least two input signal lines 14, wherein one of the input signal lines 14 is electrically connected to the first electrodes of all the thin-film transistors of the brightness detection module 11 and the color temperature detection module 12, and the other input signal line 14 is electrically connected to the first electrodes of all the thin-film transistors of the reference module 10. That is, the input signals to all the thin-film transistors of the brightness detection module 11 and the color temperature detection module 12 and the input signals to all the thin-film transistors of the reference module 10 come from different sources, so the input signals to the brightness detection module 11 and the color temperature detection module 12 and the input signals to the reference module 10 are inputted separately.

According to some embodiments, as shown in FIG. 3, the array substrate 100 comprises at least two control signal lines 15, wherein part of the control signal lines 15 are electrically connected to the control electrodes of part of all the thin-film transistors of the brightness detection module 11, the reference module 10 and the color temperature detection module 12, and the remaining control signal lines 15 are electrically connected to the control electrodes of the remaining ones of all the thin-film transistors of the brightness detection module 11, the reference module 10 and the color temperature detection module 12.

It should be noted that, all the thin-film transistors may be of the same type. For example, all the thin-film transistors are N-type or P-type transistors, so the at least two control signal lines 15 are configured to transmit the same control signals.

Through the above-mentioned arrangement mode of the control signal lines 15, among at least two control signal lines 15, part of the control signal lines 15 are configured to transmit control signals to part of all the thin-film transistors, and the remaining control signal lines 15 are configured to transmit control signals to the remaining ones of all the thin-film transistors, so the voltage drop generated when the control signal line 15 transmits the control signals may be reduced, thereby avoiding the impedance of the control signal line 15 from affecting the switching-on of the thin-film transistors.

Moreover, at least two control signal lines 15 respectively transmit control signals, and are able to provide the control signals to different thin-film transistors.

According to some embodiments, as shown in FIG. 3, the array substrate 100 comprises at least two input signal lines 14 and at least two control signal lines 15.

Part of the input signal lines 14 are electrically connected to the first electrodes of part of all the thin-film transistors of the brightness detection module 11, the reference module 10 and the color temperature detection module 12, and the remaining input signal lines 14 are electrically connected to the first electrodes of the remaining ones of all the thin-film transistors of the brightness detection module 11, the reference module 10 and the color temperature detection module 12.

Part of the control signal lines 15 are electrically connected to the control electrodes of part of all the thin-film transistors of the brightness detection module 11, the reference module 10 and the color temperature detection module 12, and the remaining control signal lines 15 are electrically connected to the control electrodes of the remaining ones of all the thin-film transistors of the brightness detection module 11, the reference module 10 and the color temperature detection module 12.

The above-mentioned arrangement mode may not only reduce the interference with the detecting current signal by the impedance of the input signal line 14, but also prevent the impedance of the control signal line 15 from affecting the on-off of the thin-film transistor under control.

According to some embodiments, as shown in FIG. 3, at least two control signal lines 15 include a first control signal line 151 and a second control signal line 152; the control electrode of each of the first thin-film transistors 111, the control electrode of each of the third thin-film transistors 1210, the control electrode of each of the fourth thin-film transistors 1220 and the control electrode of each of the fifth thin-film transistors 1230 are respectively electrically connected to the first control signal line 151, that is, the control electrodes of all the thin-film transistors of the brightness detection module 11 and the color temperature detection module 12 are electrically connected to the first control signal line 151.

The control electrode of each of the second thin-film transistors 101 is electrically connected to the second control signal line 152, that is, the control electrodes of all the thin-film transistors of the reference module 10 are electrically connected to the second control signal line 152.

By the above-mentioned arrangement mode, the first control signal line 151 provides control signals for the brightness detection module 11 and the color temperature detection module 12 (refer to FIG. 11, either P2 or P3), the second control signal line 152 provides control signals for the reference module 10 (refer to FIG. 11, the other one between P2 and P3), the control signals provided for the brightness detection module 11 and the color temperature detection module 12 and the control signals provided for the reference module 10 come from different sources, thereby realizing control of the brightness detection module 11 and the color temperature detection module 12 and control of the reference module 10 in a separate way.

Moreover, the brightness detection module 11 which detects the brightness of the ambient light and the color temperature detection module 12 which detects the proportion of the light of at least one primary color in the ambient light should be compared with the reference module 10 which serves as a reference, so independent control of the reference module 10 is conducive to ensuring the detection precision of the reference module 10, thereby ensuring the detection precision of the brightness detection module 11 and the color temperature detection module 12.

According to some embodiments, as shown in FIG. 2 and FIG. 3, the array substrate 100 further comprises a plurality of thin-film transistors 17 which are arranged on a base plate 13 and located in the active area AA. At least one first thin-film transistor 111 of the brightness detection module 11 and at least one second thin-film transistor 101 of the reference module 10 are arranged on the same layer as the plurality of thin-film transistors 17 located in the active area AA.

According to some embodiments, at least one third thin-film transistor 1210 of the first color temperature detection assembly 121, at least one fourth thin-film transistor 1220 of the second color temperature detection assembly 122 and at least one fifth thin-film transistor 1230 of the third color temperature detection assembly 123 are located on the same layer as the plurality of thin-film transistors 17 located in the active area AA.

It should be noted that, "the same layer" refers to a layer structure manufactured by forming, using the same film-forming process, a film layer for forming a specific pattern, and then processing the film layer using a mask through a one-step patterning process. According to different specific patterns, the one-step patterning process may include multiple exposure, developing or etching procedures, and the specific patterns in the formed layer structure may be continuous or discontinuous. These specific patterns may also be located at different heights or have different thicknesses.

The thin-film transistor is of a structure formed by cascading a plurality of thin film layers, including the active layer, the control electrode, the first electrode, the second electrode, etc. Here, "being arranged on the same layer" refers to that, the first thin-film transistor 111, the second thin-film transistor 101, the third thin-film transistor 1210, the fourth thin-film transistor 1220 and the fifth thin-film transistor 1230 are all located on the same layer as the corresponding film layers of the thin-film transistors 17 located in the display AA. For example, the control electrodes of the first thin-film transistor 111, the second thin-film transistor 101, the third thin-film transistor 1210, the fourth thin-film transistor 1220 and the fifth thin-film transistor 1230 are arranged on the same layer as the control electrodes of the thin-film transistors 17 located in the display AA.

It is understandable that, by the above-mentioned arrangement mode, the same film layers of a plurality of thin-film transistors 17 located in the display AA, and the first thin-film transistor 111, the second thin-film transistor 101, the third thin-film transistor 1210, the fourth thin-film transistor 1220 and the fifth thin-film transistor 1230 are capable of being manufactured with the same technological process. For example, the control electrodes of all the thin-film transistors are capable of being manufactured with the same film-forming process; the active layers of all the thin-film transistors are capable of being manufactured with the same film-forming process; or, the first electrodes and second electrodes of all the thin-film transistors are capable of being manufactured with the same film-forming process. Thus, the process costs for manufacturing the array substrate 100 are capable of being saved.

According to the embodiments of the disclosure, the control electrode of each of the thin-film transistors is a gate of the thin-film transistor, the first electrode is either a source or a drain of the thin-film transistor, and the second electrode is the other one of the source and the drain of the thin-film transistor. Since the source and the drain of the thin-film transistor are structurally symmetric, the source and drain may be not different in structure, that is, the first electrode and the second electrode of the thin-film transistor in the embodiments of the disclosure may be not different in structure. Exemplarily, in the case that the thin-film transistor is a P-type transistor, the first electrode of the thin-film transistor is the source, and the second electrode is the drain; exemplarily, in the case that the thin-film transistor is an N-type transistor, the first electrode of the thin-film transistor is the drain, and the second electrode is the source.

According to some embodiments, as shown in FIG. 2 and FIG. 3, the array substrate 100 further comprises a plurality of gate lines (GL for short) and a plurality of data lines (DL for short) which are arranged on a base plate 13 and located in the active area AA. The plurality of GLs extend along the direction X, and the plurality of DLs extend along the direction Y.

The at least one input signal line 14, the plurality of output signal lines 16 and the plurality of DLs are arranged on the same layer, and the at least one control signal line 15 and the plurality of GLs are arranged on the same layer.

By the above-mentioned arrangement mode, the plurality of DLs in the active area AA, and the at least one input signal line 14 and the plurality of output signal lines 16 are capable of being manufactured with the same technological process, and the plurality of GLs in the active area AA and the at least one control signal line 15 are capable of being manufactured with the same technological process. Thus, the process costs for manufacturing the array substrate 100 are capable of being saved.

Figure 4:
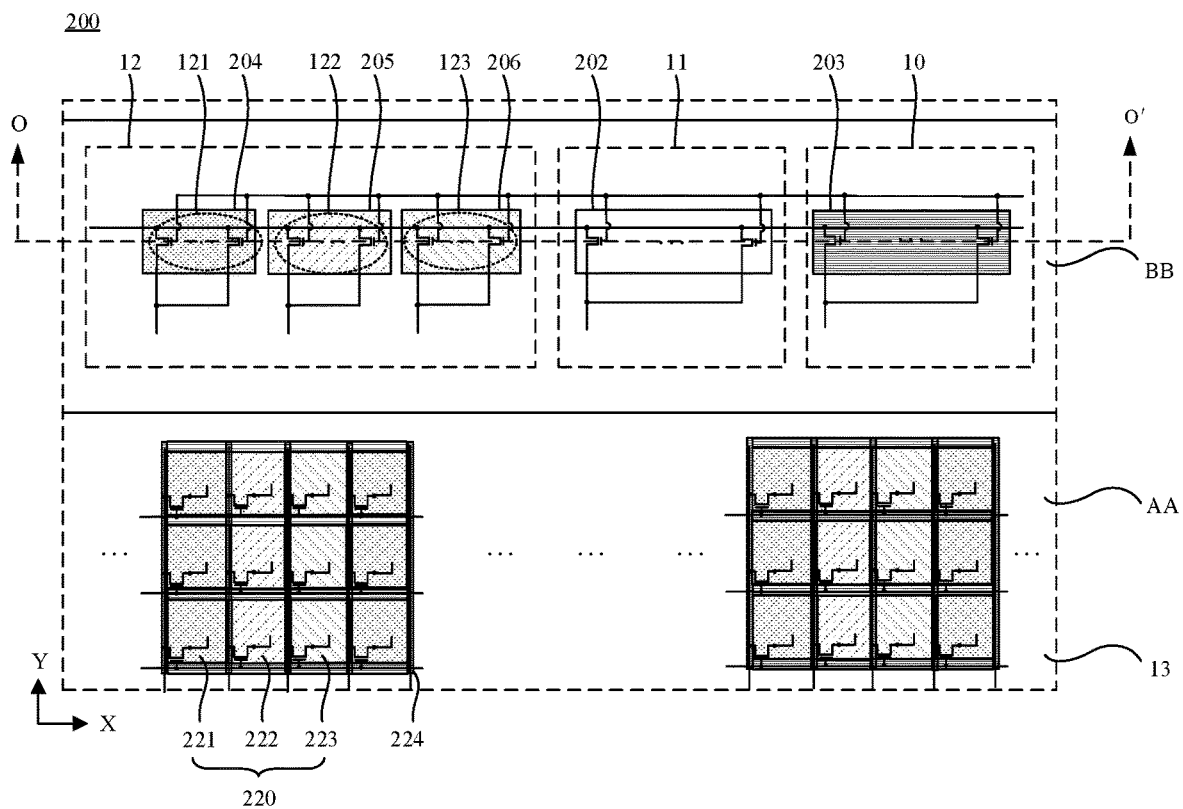
FIG. 4 is a structural diagram of a display panel according to some embodiments of the disclosure.
Figure 5:
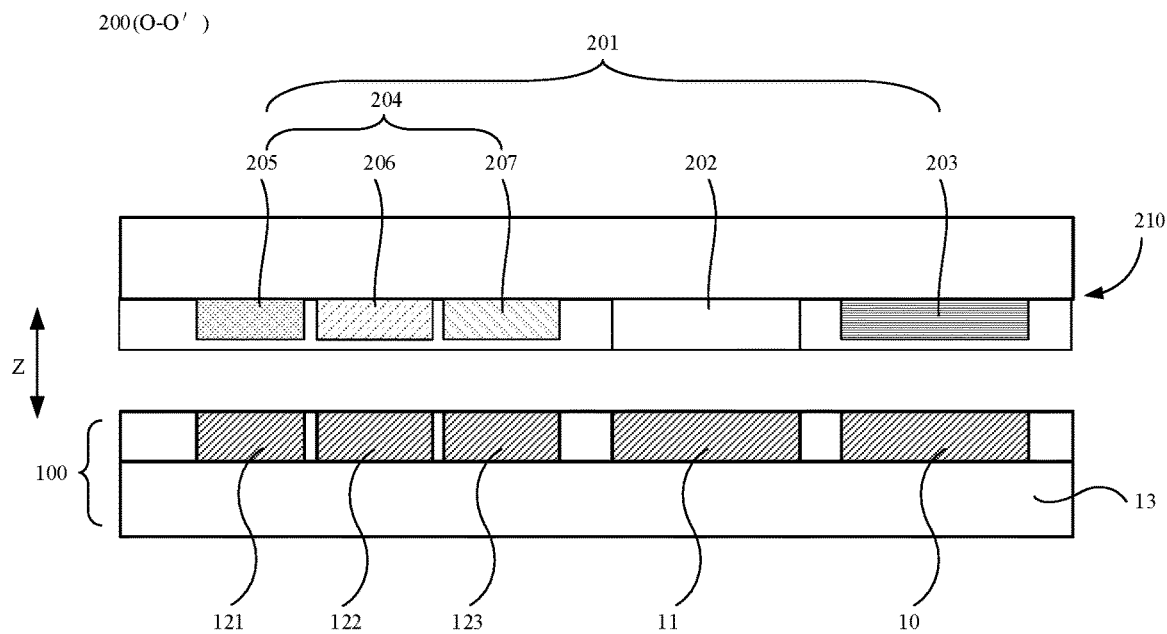
FIG. 5 is a sectional diagram of the display panel taken along line O-O' in FIG. 4.

As shown in FIG. 4 and FIG. 5, some embodiments of the disclosure provide a display panel 200, comprising the array substrate 100 according to any one of the above-mentioned embodiments, and an opposite substrate 210 arranged opposite to the array substrate 100. The opposite substrate 210 comprises a light transmitting portion 202 and a light shielding portion 203 arranged in parallel along a direction in parallel with a plane where the opposite substrate 210 is located.

As shown in FIG. 5, the light transmitting portion 202 allows the ambient light to transmit, and an orthographic projection of the light transmitting portion 202 on the array substrate 100 is at least partly superimposed with the brightness detection module 11 of the array substrate 100, so the ambient light is able to transmit the light transmitting portion 202 to irradiate the brightness detection module 11.

Exemplarily, materials of the light transmitting portion 202 include a light transmitting material. For example, as shown in FIG. 5, the opposite substrate 210 further comprises a transparent optical adhesive layer on a side thereof close to the array substrate 100, and along a direction Z perpendicular to the base plate 13 of the array substrate 100, a part of the optical adhesive layer opposite to the brightness detection module 11 may be the light transmitting portion 202; or, the light transmitting portion 202 may be a hole arranged on the optical adhesive layer.

It is understandable that, the orthographic projection of the light transmitting portion 202 on the array substrate 100 should be at least partly superimposed with the active layer of the first thin-film transistor 111, such that the ambient light is able to transmit the light transmitting portion 202 to irradiate the active layer of the first thin-film transistor 111. Thus, the first thin-film transistor 111 generates the light-generated current.

As shown in FIG. 5, the light shielding portion 203 includes a light shielding material and is able to block the ambient light, and an orthographic projection of the light shielding portion 203 on the array substrate 100 is at least partly superimposed with the reference module 10 of the array substrate 100, so the ambient light fails to transmit the light shielding portion 203 and then irradiate the reference module 10.

According to the above-mentioned embodiments of the disclosure, the ambient light transmits the light transmitting portion 202 to irradiate the brightness detection module 11; then the brightness detection module 11 generates the ambient light brightness detecting current signal in response to the ambient light and outputs the ambient light brightness detecting current signal; and the reference module 10, in the dark state without ambient light because of being blocked by the light shielding module 203, generates and outputs the reference current signal. In this way, the actual brightness of the ambient light may be obtained according to the ambient light brightness detecting current signal and the reference current signal. Since the thin-film transistors are used to form the brightness detection module 11 and the reference module 10, the brightness detection module 11 and the reference module 10 may be formed in the same process as the thin-film transistors for forming a pixel unit in the array substrate 100, and it does not need to purchase an independent ambient light sensor, thereby saving the manufacturing costs of the displaying device.

According to another embodiment, along the direction Z perpendicular to the base plate 13 of the array substrate 100, it is feasible that the light transmitting portion 202 is not arranged on a side of the brightness detection module 11 away from the base plate 13, as long as the ambient light is able to irradiate the brightness detection module 11.

According to some embodiments, as shown in FIG. 4 and FIG. 5, the opposite substrate 210 further comprises a plurality of light filtering portions 204, and along a direction in parallel with the plane where the opposite substrate 210 is located, the plurality of light filtering portions 204 are arranged in parallel with the light transmitting portion 202 and the light shielding portion 203. The plurality of light filtering portions 204 include at least one first primary color filtering portion 205, at least one second primary color filtering portion 206 and at least one third primary color filtering portion 207.

As shown in FIG. 5, an orthographic projection of at least one first primary color filtering portion 205 on the array substrate 100 is at least partly superimposed with the first color temperature detection assembly 121. The first primary color filtering portion 205 allows light of the first primary color to pass and blocks light of other colors, such that the light of the first primary color in the ambient light irradiates the first color temperature detection assembly 121.

It is understandable that, an orthographic projection of at least one first primary color filtering portion 205 on the array substrate 100 should be at least partly superimposed with the active layer of the third thin-film transistor 1210, such that the light of the first primary color in the ambient light is able to irradiate the active layer of the third thin-film transistor 1210. Thus, the third thin-film transistor 1210 generates the light-generated current.

As shown in FIG. 5, an orthographic projection of at least one second primary color filtering portion 206 on the array substrate 100 is at least partly superimposed with the second color temperature detection assembly 122. The second primary color filtering portion 206 allows light of the second primary color to pass and blocks light of other colors, such that the light of the second primary color in the ambient light irradiates the second color temperature detection assembly 122.

It is understandable that, the orthographic projection of at least one second primary color filtering portion 206 on the array substrate 100 should be at least partly superimposed with the active layer of the fourth thin-film transistor 1220, such that the light of the second primary color in the ambient light is able to irradiate the active layer of the fourth thin-film transistor 1220. Thus, the fourth thin-film transistor 1220 generates the light-generated current.

As shown in FIG. 5, an orthographic projection of at least one third primary color filtering portion 207 on the array substrate 100 is at least partly superimposed with the third color temperature detection assembly 123. The third primary color filtering portion 207 allows light of the third primary color to pass and blocks light of other colors, such that the light of the third primary color in the ambient light irradiates the third color temperature detection assembly 123.

It is understandable that, the orthographic projection of at least one third primary color filtering portion 207 on the array substrate 100 should be at least partly superimposed with the active layer of the fifth thin-film transistor 1230, such that the light of the third primary color in the ambient light is able to irradiate the active layer of the fifth thin-film transistor 1230. Thus, the fifth thin-film transistor 1230 generates the light-generated current.

Figure 6:
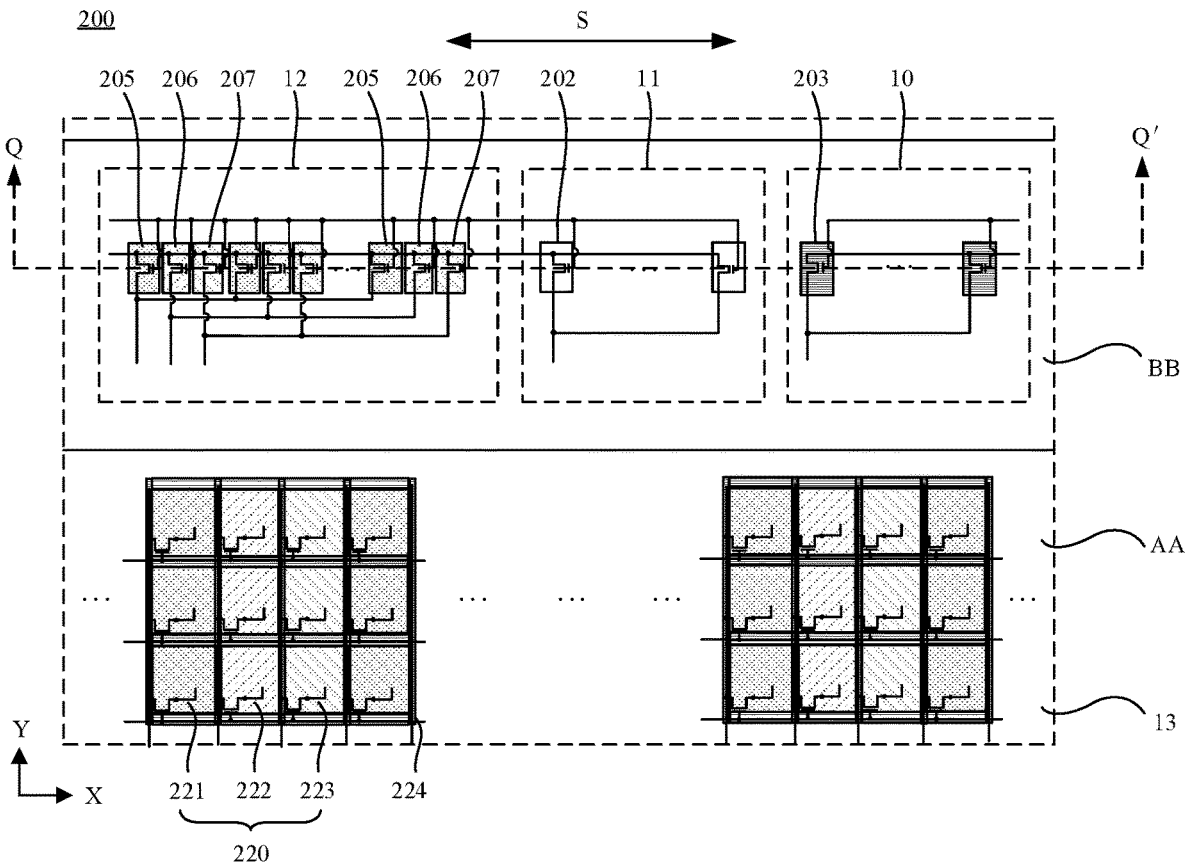
FIG. 6 is another structural diagram of the display panel according to some embodiments of the disclosure.
Figure 7:
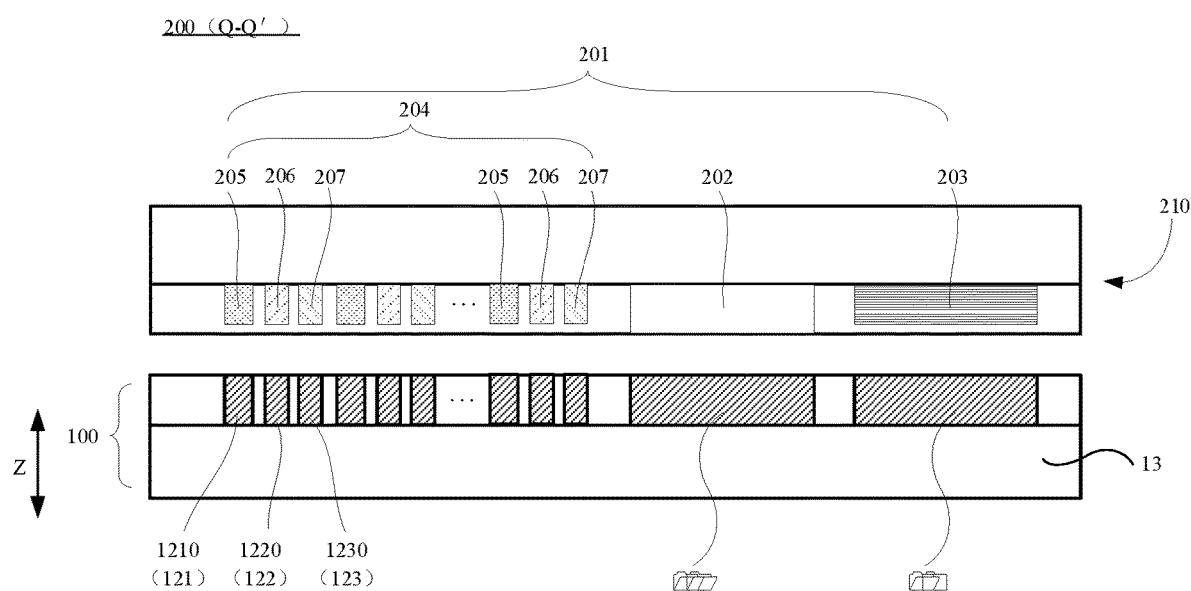
FIG. 7 is a sectional diagram of the display panel taken along line Q-Q' in FIG. 6.

According to some embodiments, as shown in FIG. 6 and FIG. 7, at least one third thin-film transistor 1210, at least one fourth thin-film transistor 1220 and at least one fifth thin-film transistor 1230 are circularly arranged in turn along the length extension direction S of the peripheral area BB. Under such a circumstance, the orthographic projection of at least one first primary color filtering portion 205 on the array substrate 100 is at least partly superimposed with one third thin-film transistor 1210, the orthographic projection of at least one second primary color filtering portion 206 on the array substrate 100 is at least partly superimposed with one fourth thin-film transistor 1220, and the orthographic projection of at least one third primary color filtering portion 207 on the array substrate 100 is at least partly superimposed with one fifth thin-film transistor 1230.

The above arrangement mode avoids gathering the filtering portions of the same color, thereby preventing human eyes from telling color difference among the first primary color filtering portion 205, the second primary color filtering portion 206 and the third primary color filtering portion 207, which may otherwise affect the appearance effect of the displaying device.

According to some embodiments, as shown in FIG. 4 and FIG. 6, the opposite substrate 210 further comprises a color film layer 220 and a black matrix 224, which are located in the active area AA of the display panel 200, wherein the color film layer 220 comprises a plurality of first primary color ring resistors 221, a plurality of second primary color ring resistors 222 and a plurality of third primary color ring resistors 223.

At least one first primary color filtering portion 205 is made of the same material and located on the same layer as the plurality of first primary color ring resistors 221; at least one second primary color filtering portion 206 is made of the same material and located on the same layer as the plurality of second primary color ring resistors 222; and, at least one third primary color filtering portion 207 is made of the same material and located on the same layer as the plurality of third primary color ring resistors 223.

It is understandable that, the first primary color filtering portion 205 and the first primary color ring resistors 221 share the same color; the second primary color filtering portion 206 and the second primary color ring resistors 222 share the same color; and, the third primary color filtering portion 207 and the third primary color ring resistors 223 share the same color.

By the above-mentioned arrangement mode, the first primary color filtering portion 205 and the first primary color ring resistors 221 are capable of being manufactured with the same film-forming process; the second primary color filtering portion 206 and the second primary color ring resistors 222 are capable of being manufactured with the same film-forming process; and the third primary color filtering portion 207 and the third primary color ring resistors 223 are capable of being manufactured with the same film-forming process. Thus, the process costs for manufacturing the array substrate 100 are capable of being saved.

According to some embodiments, as shown in FIG. 4 and FIG. 6, the light shielding portion 203 is made of the same material and located on the same layer as the black matrix 224.

It is understandable that, both the light shielding portion 203 and the black matrix 224 are not pervious to light.

By the above-mentioned arrangement mode, the light shielding portion 203 and the black matrix 224 are capable of being manufactured with the same film-forming process, thereby saving the process costs for manufacturing the array substrate 100.

According to some embodiments, as shown in FIG. 4 and FIG. 6, at least one first primary color filtering portion 205 is made of the same material and located on the same layer as the plurality of first primary color ring resistors 221; at least one second primary color filtering portion 206 is made of the same material and located on the same layer as the plurality of second primary color ring resistors 222; at least one third primary color filtering portion 207 is made of the same material and located on the same layer as the plurality of third primary color ring resistors 223; and, the light shielding portion 203 is made of the same material and located on the same layer as the black matrix 224. Thus, the process costs for manufacturing the array substrate 100 may further be saved.

Figure 8:
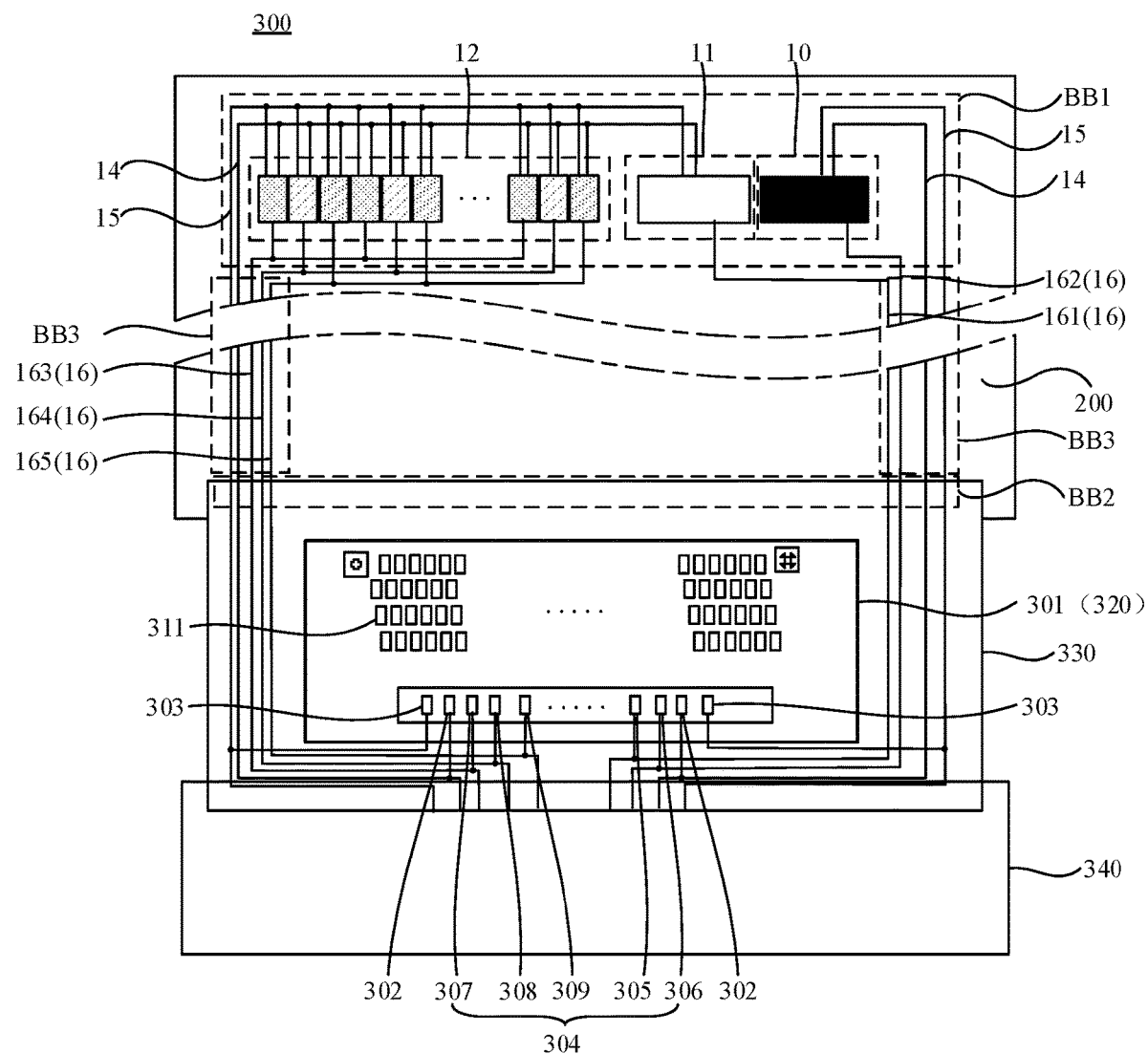
FIG. 8 is a structural diagram of a displaying device according to some embodiments of the disclosure.

As shown in FIG. 8, some embodiments of the disclosure provide a displaying device 300, comprising the display panel 200, and a detection driver 301.

The detection driver 301 is electrically connected to a brightness detection module 11 and a reference module 10 of the array substrate 100 of the display panel 200. The detection driver 301 is configured to transmit control signals and input signals to the brightness detection module 11 and the reference module 10 to control the brightness detection module 11 and the reference module 10 to work, receive an ambient light brightness detecting current signal from the brightness detection module 11 and a reference current signal from the reference module 10, and process the ambient light brightness detecting current signal and the reference current signal.

According to the embodiment of the disclosure, the detection driver 301 transmits control signals and input signals to the brightness detection module 11, and transmits control signals and input signals to the reference module 10, so as to control the brightness detection module 11 and the reference module 10 to work. The brightness detection module 11 receives irradiation from the ambient light, generates the ambient light brightness detecting current signal in response to the ambient light and outputs the ambient light brightness detecting current signal to the detection driver 301. The reference module 10, at the dark state without ambient light, generates the reference current signal and outputs the reference current signal to the detection driver 301, and the detection driver 301 processes the ambient light brightness detecting current signal and the reference current signal to obtain the actual brightness of the ambient light.

According to some embodiments, as shown in FIG. 8, the detection driver 301 is also electrically connected to a color temperature detection module 12, and configured to transmit control signals and input signals to the color temperature detection module 12 to control the color temperature detection module 12 to work, receive at least one color temperature detection current signal from the color temperature detection module 12, and process the at least one color temperature detection current signal.

The detection driver 301 transmits control signals and input signals to the color temperature detection module 12 to control the color temperature detection module 12 to work. The color temperature detection module 12 receives light of at least one primary color in the ambient light, generates at least one color temperature detecting current signal in response to the light of at least one primary color, and outputs the at least one color temperature detecting current signal to the detection driver 301. The detection driver 301 is able to obtain the actual brightness of the light of at least one primary color according to the at least one color temperature detecting current signal and the reference current signal. By comparing the actual brightness of the light of at least one primary color with the actual brightness of the ambient light, the ratio of the light of at least one primary color in the ambient light is capable of being obtained.

According to some embodiments, as shown in FIG. 8, the detection driver 301 comprises at least one input pin 302, at least one control pin 303 and a plurality of output pins 304. The plurality of output pins 304 include a first output pin 305, a second output pin 306, a third output pin 307, a fourth output pin 308 and a fifth output pin 309.

At least one input signal line 14 is respectively electrically connected to at least one input pin 302 to receive input signals from at least one input pin 302.

At least one control signal line 15 is respectively electrically connected to at least one control pin 303 to receive control signals from at least one control pin 303.

The first output signal line 161 is connected with the first output pin 305 to transmit the ambient light brightness detecting current signal to the first output pin 305.

The second output signal line 162 is connected with the second output pin 306 to transmit the reference current signal to the second output pin 306.

The third output signal line 163 is electrically connected to the third output pin 307, the fourth output signal line 164 is electrically connected to the fourth output pin 308, and the fifth output signal line 165 is electrically connected to the fifth output pin 309, so as to transmit the color temperature detecting current signals to the pins in electrical connection.

According to some embodiments, as shown in FIG. 8, the peripheral area BB comprises a first peripheral sub-area BB1, a second peripheral sub-area BB2, a third peripheral sub-area BB3 and a fourth peripheral sub-area BB4, wherein the first peripheral sub-area BB1 and the second peripheral sub-area BB2 are respectively located on two opposite sides of the active area AA along a first direction of the plane where the array substrate 100 is located; and the third peripheral sub-area BB3 and the fourth peripheral sub-area BB4 are respectively located on two opposite sides of the active area AA along a second direction of the plane where the array substrate 100 is located. The first direction is, for example, the extension direction X of the GL of the array substrate 100, and the second direction, for example, is the extension direction Y of the DL of the array substrate 100. As shown in FIG. 8, in the case where the brightness detection module 11, the reference module 10 and the color temperature detection module 12 are arranged in the first peripheral sub-area BB1 of the peripheral area BB, and the second peripheral sub-area BB2 of the peripheral area BB comprises a binding area for binding a flexible printed circuit 330. All the signal lines (including the control signal line 15, the input signal line 14 and the output signal lines 161-165) may extend from the first peripheral sub-area to the second peripheral sub-area respectively along the third peripheral sub-area and the fourth peripheral sub-area, such that the brightness detection module 11, the reference module 10 and the color temperature detection module 12 are electrically connected to the detection driver 301 arranged on the flexible printed circuit 330.

Figure 9:
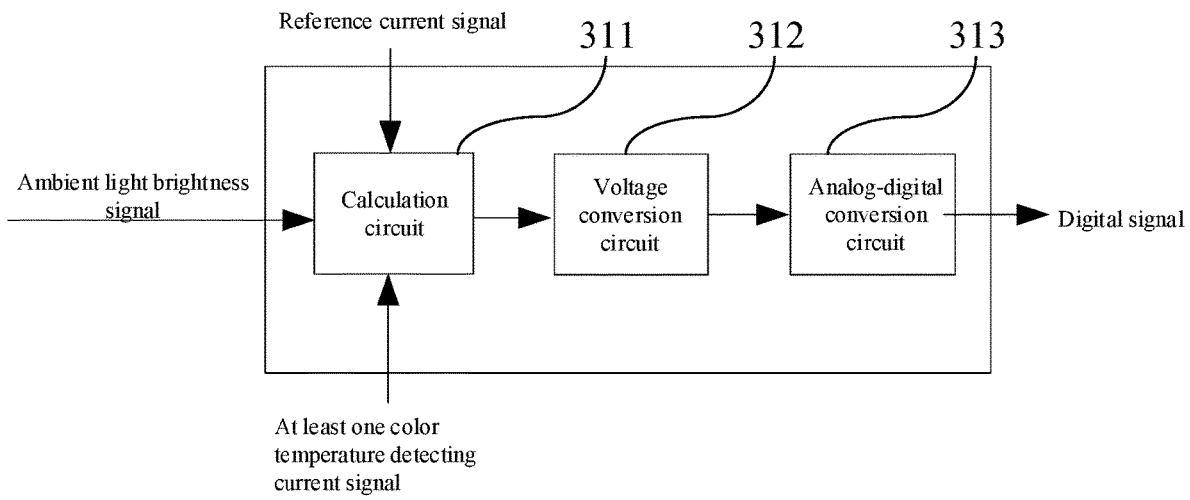
FIG. 9 is a structural diagram of a detection circuit of a detection driver according to some embodiments of the disclosure.

As shown in FIG. 9, the detection driver 301 further comprises a detection circuit 310, which is respectively electrically connected to at least one input pin 302, at least one control pin 303 and a plurality of output pins 304. The detection circuit 310 is configured to calculate the difference between the ambient light brightness detecting current signal and the reference current signal, calculate the difference between the at least one color temperature detecting current signal and the reference current signal, and process the obtained differences.

The difference between the ambient light brightness detecting current signal and the reference current signal is calculated to obtain the light-generated current generated when the ambient light irradiates the active light of the thin-film transistor, and the actual brightness of the ambient light is obtained according to the light-generated current.

Similarly, the difference between the at least one color temperature detecting current signal and the reference current signal is calculated to obtain the light-generated current generated when the light of at least one primary color in the ambient light irradiates the active layer of the thin-film transistor, and the actual brightness of the light of at least one primary color is obtained according to the light-generated current.

According to some embodiments, as shown in FIG. 9, the detection circuit 310 comprises a calculation circuit 311, a voltage conversion circuit 312 and an analog-digital conversion circuit 313.

The calculation circuit 311 is configured to receive the ambient light brightness detecting current signal and the reference current signal, and calculate the difference between the ambient light brightness detecting current signal and the reference current signal to obtain a first difference current signal; and, the calculation circuit is configured to receive at least one color temperature detecting current signal and the reference current signal, and calculate the difference between the at least one color temperature detecting current signal and the reference current signal to obtain at least one second difference current signal.

The voltage conversion circuit 312 is electrically connected to the calculation circuit 311, and configured to convert the first difference current signal and the at least one second difference current signal into voltage signals to obtain a first difference voltage signal and at least one second difference voltage signal.

Figure 10:
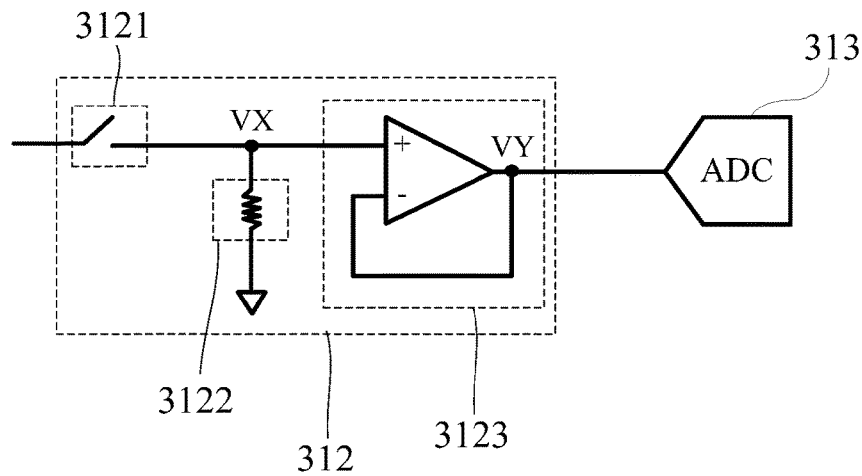
FIG. 10 is a circuit diagram of a voltage conversion circuit and an analog-digital conversion circuit of the detection circuit according to some embodiments of the disclosure.

Exemplarily, as shown in FIG. 10, the voltage conversion circuit 312 may comprise a switch 3121, a resistor 3122 and an operational amplifier 3123, wherein the switch 3121 and the resistor 3122 both are electrically connected to a node VX, the node VX is electrically connected to an in-phase input end of the operation amplifier 3123, an inverse input end and an output end of the operation amplifier 3123 are electrically connected to a node VY, and the voltage of the node VY is equal to the voltage of the node VX. It is known that, the current signal inputted into the voltage conversion circuit 312 is converted into a voltage signal, and the voltage value of the voltage signal is the product of the current value of the current signal multiplied by the resistance value of the resistor 3122.

As shown in FIG. 10, the analog-digital conversion circuit 313 is electrically connected to the voltage conversion circuit 312 and configured to convert the first difference voltage signal and at least one second difference voltage signal from analog signals into digital signals.

According to some embodiments, as shown in FIG. 8, the displaying device 300 further comprises a source driver 320, and the source driver 320 is electrically connected to the plurality of DLs of the display panel 200. The source driver 320 is configured to transmit data signals to the plurality of DLs.

Exemplarily, the source driver 320 comprises a plurality of data signal pins 311, and one DL of the display panel 200 is electrically connected to one data signal pin 311 of the source driver 320.

The displaying device 300 further comprises the flexible printed circuit 330, wherein the detection driver 301 and the source driver 320 are arranged on the flexible printed circuit 330, the detection driver 301 and the source driver 320 are electrically connected to the display panel 200 through the flexible printed circuit 330, and the detection driver 301 and the source driver 320 are integrated.

The displaying device 300 further comprises a drive circuit board 340, wherein the drive circuit board 340 is electrically connected to the detection driver 301 and the source driver 320 through the flexible printed circuit 330.

The drive circuit board 340 is configured to obtain the actual brightness of the ambient light according to the difference between the ambient light brightness detecting current signal and the reference current signal from the detection driver 301, and adjust the display brightness of the display panel 200 according to the actual brightness of the ambient light such that the display brightness is adapted to the actual brightness of the ambient light.

Exemplarily, in the case where the displaying device 300 is an LCD (Liquid Crystal Display, LCD for short), the displaying device 300 further comprises a backlight driver, and the drive circuit board 340 is able to output, according to the actual brightness of the ambient light, a backlight adjusting signal to the backlight driver to control the backlight driver to adjust the backlight brightness, thereby adjusting the display brightness of the display panel 200 to adapt to the actual brightness of the ambient light.

Exemplarily, in the case where the displaying device 300 is an OLED (Organic Light-Emitting Diode, OLED for short), the displaying device 300 further comprises a plurality of light emitting devices, and the drive circuit board 340 is able to adjust, according to the actual brightness of the ambient light, the size of a voltage signal outputted to the light emitting devices to control the emitted-light brightness of the light emitting devices, thereby adjusting the display brightness of the display panel 200 to adapt to the actual brightness of the ambient light.

It should be noted that, "adapt to" refers to increasing the display brightness of the display panel 200 if the actual brightness of the ambient light is relatively high, or reducing the display brightness of the display panel 200 if the actual brightness of the ambient light is relatively low, such that human eyes are able to see the display images on the display panel 200 clearly.

Moreover, the drive circuit board 340 is further configured to calculate, according to the difference between the at least one color temperature detecting current signal and the reference current signal from the detection driver 301 and the actual brightness of the ambient light, the proportion of the brightness of light of at least one primary color in the ambient light in the actual brightness of the ambient light, obtain the color temperature of the ambient light according to the proportion corresponding to the light of at least one primary color, and control the display panel 200 to send prompt information for promoting a user of eye care.

It is understandable that, the drive circuit board 340 obtains the actual brightness of the light of at least one primary color according to the difference between the at least one color temperature detecting current signal and the reference current signal from the detection driver 301, and calculate the proportion of the actual brightness of the light of at least one primary color in the actual brightness of the ambient light to obtain the color temperature of the ambient light.

Exemplarily, "preset condition" refers to a safety threshold of the color temperature of the ambient light on the premise that the ambient light does not damage user's eyes. "The color temperature meets the preset condition" refers to that the color temperature is greater than or equal to the safety threshold. For example, when the safety threshold is 4000 K (Kelvin), the color temperature of greater than 4000 K indicates that the brightness of blue light accounts for a high percentage of the actual brightness of the ambient light and exceeds the tolerable scope of human body.

Under the condition that the color temperature of the ambient light meets the preset condition, the drive circuit board 340 controls the display panel 200 to send prompt information for prompting the user of eye care. For example, the drive circuit board 340 is able to control the display panel 200 to display the image of the prompt information, thus prompting the user of eye care or skin care.

For the array substrate according to the embodiments of the disclosure, in the peripheral area of the array substrate, at least one thin-film transistor is used to manufacture the brightness detection module, and at least one thin-film transistor is used to manufacture the reference module. The brightness detection module is configured to receive ambient light, generate the ambient light brightness detecting current signal in response to the ambient light and output the ambient light brightness detecting current signal; and the reference module is configured to, in the dark state without ambient light, generate and output the reference current signal. In this way, the actual brightness of the ambient light may be obtained according to the ambient light brightness detecting current signal and the reference current signal. Since the thin-film transistors are used to form the brightness detection module and the reference module, the brightness detection module and the reference module may be formed in the same process as the thin-film transistors for forming a pixel unit in the array substrate, and it does not need to purchase an independent ambient light sensor, thereby saving the manufacturing costs of a displaying device.

The above embodiments are merely specific ones of the disclosure, and should not be construed as limiting the protective scope of the disclosure. All those variations and amendments easily made within the technical scope of disclosure by those ordinarily skilled in the art shall fall within the protective scope of the disclosure. Therefore, the protective scope of the disclosure shall be subject to that of the claims.

The invention claimed is:

1. An array substrate, having an active area and a peripheral area located on at least one side of the active area; the array substrate comprising:
   a brightness detection module arranged in the peripheral area, comprising a plurality of first thin-film transistors in a parallel connection; the brightness detection module being configured to receive ambient light, generate an ambient light brightness detecting current signal in response to the ambient light and output the ambient light brightness detecting current signal; and,
   a reference module arranged in the peripheral area, comprising a plurality of second thin-film transistors in a parallel connection; the reference module being configured to, in a dark state without ambient light, generate and output a reference current signal.

2. The array substrate according to claim 1, wherein the ambient light comprises at least three primary colors;
   the array substrate further comprising:
   a color temperature detection module arranged in the peripheral area, comprising at least one thin-film transistor; the color temperature detection module being configured to receive the ambient light, and generate at least one color temperature detecting current signal in response to light of at least one primary color in the ambient light.

3. The array substrate according to claim 2, wherein the ambient light comprises light of a first primary color, light of a second primary color and light of a third primary color;
   the color temperature detection module comprises:
   a first color temperature detection assembly, comprising at least one third thin-film transistor; the first color temperature detection assembly being configured to receive the light of the first primary color in the ambient light, and generate a first color temperature detecting current signal in response to the light of the first primary color;
   a second color temperature detection assembly, comprising at least one fourth thin-film transistor; the second color temperature detection assembly being configured to receive the light of the second primary color in the ambient light, and generate a second color temperature detecting current signal in response to the light of the second primary color; and, a third color temperature detection assembly, comprising at least one fifth thin-film transistor; the third color temperature detection assembly being configured to receive the light of the third primary color in the ambient light, and generate a third color temperature detecting current signal in response to the light of the third primary color.

4. The array substrate according to claim 3, wherein the first color temperature detection assembly comprises a plurality of third thin-film transistors in a parallel connection, the second color temperature detection assembly comprises a plurality of fourth thin-film transistors in a parallel connection, and the third color temperature detection assembly comprises a plurality of fifth thin-film transistors in a parallel connection.

5. The array substrate according to claim 4, further comprising: at least one input signal line, at least one control signal line and a plurality of output signal lines, wherein the plurality of output signal lines comprise at least a first output signal line, a second output signal line, a third output signal line, a fourth output signal line and a fifth output signal line;
wherein a control electrode of the first thin-film transistor is electrically connected to one said control signal line, a first electrode of the first thin-film transistor is electrically connected to one said input signal line, and a second electrode of the first thin-film transistor is electrically connected to the first output signal line;
wherein a control electrode of the second thin-film transistor is electrically connected to one said control signal line, a first electrode of the second thin-film transistor is electrically connected to one said input signal line, and a second electrode of the second thin-film transistor is electrically connected to the second output signal line;
wherein a control electrode of the third thin-film transistor is electrically connected to one said control signal line, a first electrode of the third thin-film transistor is electrically connected to one said input signal line, and a second electrode of the third thin-film transistor is electrically connected to the third output signal line;
wherein a control electrode of the fourth thin-film transistor is electrically connected to one said control signal line, a first electrode of the fourth thin-film transistor is electrically connected to one said input signal line, and a second electrode of the fourth thin-film transistor is electrically connected to the fourth output signal line; and,
wherein a control electrode of the fifth thin-film transistor is electrically connected to one said control signal line, a first electrode of the fifth thin-film transistor is electrically connected to one said input signal line, and a second electrode of the fifth thin-film transistor is electrically connected to the fifth output signal line.

6. The array substrate according to claim 5, comprising:
at least two input signal lines, wherein part of the input signal lines are electrically connected to the first electrodes of part of all the thin-film transistors of the brightness detection module, the reference module and the color temperature detection module, and the remaining input signal lines are electrically connected to the first electrodes of the remaining ones of all the thin-film transistors of the brightness detection module, the reference module and the color temperature detection module; and the at least two input signal lines being configured to transmit identical input signals; and/or,
at least two control signal lines, wherein part of the control signal lines are electrically connected to the control electrodes of part of all thin-film transistors of the brightness detection module, the reference module and the color temperature detection module, and the remaining control signal lines are electrically connected to the control electrodes of the remaining ones of all the thin-film transistors of the brightness detection module, the reference module and the color temperature detection module; and the at least two control signal lines being configured to transmit identical control signals.

7. The array substrate according to claim 6, wherein the at least two control signal lines comprise a first control signal line and a second control signal line;
the control electrode of each of the plurality of first thin-film transistors, the control electrode of each of the third thin-film transistors, the control electrode of each of the fourth thin-film transistors, and the control electrode of each of the fifth thin-film transistors are electrically connected to the first control signal line, respectively; and,
the control electrode of each of the plurality of second thin-film transistors is electrically connected to the second control signal line.

8. The array substrate according to claim 4, wherein the first color temperature detection assembly, the second color temperature detection assembly and the third color temperature detection assembly are arranged in turn along a length extension direction of the peripheral area where the color temperature detection module is located; or,
the at least one third thin-film transistor, the at least one fourth thin-film transistor and the at least one fifth thin-film transistor are circularly arranged in turn along the length extension direction of the peripheral area where the color temperature detection module is located.

9. The array substrate according to claim 4, wherein the number of the third thin-film transistors of the first color temperature detection assembly, the number of the fourth thin-film transistors of the second color temperature detection assembly, the number of the fifth thin-film transistors of the third color temperature detection assembly, and the number of the plurality of first thin-film transistors of the brightness detection module are equal to the number of the plurality of second thin-film transistors of the reference module.

10. The array substrate according to claim 1, further comprising:
a plurality of thin-film transistors arranged in the active area;
wherein the plurality of first thin-film transistors of the brightness detection module and the plurality of second thin-film transistors of the reference module are arranged on a same layer as the plurality of thin-film transistors located in the active area; and,
under the condition that the array substrate further comprises a color temperature detection module and the color temperature detection module comprises at least one third thin-film transistor, at least one fourth thin-film transistor and at least one fifth thin-film transistor, the at least one third thin-film transistor, the at least one fourth thin-film transistor and the at least one fifth thin-film transistor are located on a same layer as the plurality of thin-film transistors located in the active area.

11. The array substrate according to claim 1, wherein peripheral areas where the brightness detection module and the reference module are located are on a same side of the active area; and,
   under the condition that the array substrate further comprises a color temperature detection module, the color temperature detection module and the brightness detection module are located on a same side of the active area.

12. A display panel, comprising:
   the array substrate according to claim 1; and
   an opposite substrate arranged opposite to the array substrate, comprising a light transmitting portion and a light shielding portion arranged in parallel along a direction in parallel with a plane where the opposite substrate is located,
   wherein the light transmitting portion allows ambient light to transmit, and an orthographic projection of the light transmitting portion on the array substrate is at least partly superimposed with the brightness detection module of the array substrate;
   the light shielding portion is made of a light shielding material and is able to block the ambient light, and an orthographic projection of the light shielding portion on the array substrate is at least partly superimposed with the reference module of the array substrate.

13. The display panel according to claim 12, further comprising a color temperature detection module, wherein the color temperature detection module comprises a first color temperature detection assembly, a second color temperature detection assembly and a third color temperature detection assembly;
   wherein the opposite substrate further comprises a plurality of light filtering portions, which are arranged in parallel with the light transmitting portion and the light shielding portion along a direction parallel to the plane where the opposite substrate is located, and the plurality of light filtering portions comprise at least one first primary color filtering portion, at least one second primary color filtering portion and at least one third primary color filtering portion;
   wherein an orthographic projection of the at least one first primary color filtering portion on the array substrate is at least partly superimposed with the first color temperature detection assembly, an orthographic projection of the at least one second primary color filtering portion on the array substrate is at least partly superimposed with the second color temperature detection assembly, and an orthographic projection of the at least one third primary color filtering portion on the array substrate is at least partly superimposed with the third color temperature detection assembly.

14. The display panel according to claim 13, wherein the opposite substrate further comprises a color film layer and a black matrix, which are located in an active area of the display panel, and the color film layer comprises a plurality of first primary color ring resistors, a plurality of second primary color ring resistors and a plurality of third primary color ring resistors;
   wherein the at least one first primary color filtering portion is made of a same material and located on a same layer as the plurality of first primary color ring resistors, the at least one second primary color filtering portion is made of a same material and located on a same layer as the plurality of second primary color ring resistors, and the at least one third primary color filtering portion is made of a same material and located on a same layer as the plurality of third primary color ring resistors; and/or,
   the light shielding portion is made of a same material and located on a same layer as the black matrix.

15. A display device, comprising:
   the display panel according to claim 13; and,
   a detection driver, electrically connected to the brightness detection module and the reference module of the array substrate of the display panel, and configured to transmit control signals and input signals to the brightness detection module and the reference module to control the brightness detection module and the reference module to work, receive the ambient light brightness detecting current signal from the brightness detection module and the reference current signal from the reference module, and process the ambient light brightness detecting current signal and the reference current signal.

16. The displaying device according to claim 15, wherein the array substrate comprises a color temperature detection module;
   the detection driver is further electrically connected to the color temperature detection module, and configured to transmit control signals and input signals to the color temperature detection module to control the color temperature detection module to work, receive at least one color temperature detection current signal from the color temperature detection module, and process the at least one color temperature detection current signal.

17. The displaying device according to claim 16, wherein the array substrate comprises: at least one input signal line, at least one control signal line and a plurality of output signal lines; the plurality of output signal lines comprise at least a first output signal line, a second output signal line, a third output signal line, a fourth output signal line and a fifth output signal line;
   the detection driver comprises:
   a plurality of connecting pins, comprising at least one input pin, at least one control pin and a plurality of output pins; wherein the plurality of output pins comprise at least a first output pin, a second output pin, a third output pin, a fourth output pin and a fifth output pin; wherein the at least one input signal line is respectively electrically connected to the at least one input pin, the at least one control signal line is respectively electrically connected to the at least one control pin, the first output signal line is electrically connected to the first output pin, the second output signal line is electrically connected to the second output pin, the third output signal line is electrically connected to the third output pin, the fourth output signal line is electrically connected to the fourth output pin, and fifth output signal line is electrically connected to the fifth output pin; and,
   a detection circuit, electrically connected to the at least one input pin, the at least one control pin and the plurality of output pins, and configured to calculate a difference between the ambient light brightness detecting current signal and the reference current signal, calculate a difference between the at least one color temperature detecting current signal and the reference current signal, and process the obtained differences.

18. The display device according to claim 17, wherein the detection circuit comprises:
   a calculation circuit, configured to calculate the difference between the ambient light brightness detecting current signal and the reference current signal to obtain a first difference current signal, and calculate the difference between the at least one color temperature detecting current signal and the reference current signal to obtain at least one second difference current signal;

a voltage conversion circuit, electrically connected to the calculation circuit, and configured to convert the first difference current signal and the at least one second difference current signal into voltage signals to obtain a first difference voltage signal and at least one second difference voltage signal; and, an analog-digital conversion circuit, electrically connected to the voltage conversion circuit, and configured to convert the first difference voltage signal and the at least one second difference voltage signal from analog signals into digital signals.

19. The display device according to claim 17, further comprising:

a source driver, electrically connected to a plurality of data lines of the display panel, and configured to transmit data signals to the plurality of data lines;

a flexible printed circuit, wherein the detection driver and the source driver are arranged on the flexible printed circuit, the detection driver and the source driver are electrically connected to the display panel through the flexible printed circuit; and the detection driver and the source driver are integrated;

a drive circuit board, electrically connected to the detection driver and the source driver through the flexible printed circuit;

wherein the drive circuit board is configured to obtain actual brightness of the ambient light according to the difference between the ambient light brightness detecting current signal and the reference current signal from the detection driver, and adjust display brightness of the display panel according to the actual brightness of the ambient light such that the display brightness is adapted to the actual brightness of the ambient light; and, wherein the drive circuit board is configured to calculate, according to the difference between the at least one color temperature detecting current signal and the reference current signal from the detection driver and the actual brightness of the ambient light, the proportion of the brightness of light of at least one primary color in the ambient light in the actual brightness of the ambient light, obtain a color temperature of the ambient light according to the proportion corresponding to the light of at least one primary color, and control the display panel to send prompt information for promoting a user of eye care.

* * * * *